(12) United States Patent
Yamazaki

(10) Patent No.: US 8,513,090 B2
(45) Date of Patent: Aug. 20, 2013

(54) METHOD FOR MANUFACTURING SEMICONDUCTOR SUBSTRATE, AND SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 139 days.

(21) Appl. No.: 12/831,399

(22) Filed: Jul. 7, 2010

(65) Prior Publication Data

US 2011/0012131 A1 Jan. 20, 2011

(30) Foreign Application Priority Data

Jul. 16, 2009 (JP) .................... 2009-167615

(51) Int. Cl.
*H01L 21/30* (2006.01)
*H01L 21/46* (2006.01)

(52) U.S. Cl.
USPC ......... 438/455; 438/105; 257/77; 257/341; 257/401; 257/328; 257/E29.104; 257/E29.255; 257/E21.567

(58) Field of Classification Search
USPC ............. 438/455, 105; 257/77, 341, 401, 257/328, E29.104, E29.255, E21.567
See application file for complete search history.

(56) References Cited

U.S. PATENT DOCUMENTS

| | | | |
|---|---|---|---|
| 4,983,538 A | 1/1991 | Gotou | |
| 5,667,586 A | 9/1997 | Ek et al. | |
| 5,759,908 A | 6/1998 | Steckl et al. | |
| 6,251,754 B1 | 6/2001 | Ohshima et al. | |
| 6,312,797 B1 | 11/2001 | Yokokawa et al. | |
| 6,391,799 B1 | 5/2002 | Di Cioccio | |
| 6,534,380 B1 | 3/2003 | Yamauchi et al. | |
| 6,867,067 B2 | 3/2005 | Ghyselen et al. | |
| 7,115,481 B2 | 10/2006 | Ghyselen et al. | |
| 7,262,113 B2 | 8/2007 | Ghyselen et al. | |
| 8,043,937 B2 | 10/2011 | Takayama | |
| 2003/0107041 A1* | 6/2003 | Tanimoto et al. | 257/77 |
| 2007/0170503 A1 | 7/2007 | Allibert et al. | |
| 2008/0064182 A1* | 3/2008 | Hebras | 438/455 |
| 2008/0246109 A1 | 10/2008 | Ohnuma et al. | |
| 2008/0280420 A1 | 11/2008 | Yamazaki | |
| 2009/0072343 A1 | 3/2009 | Ohnuma et al. | |
| 2009/0117703 A1* | 5/2009 | Yamazaki | 438/406 |
| 2009/0140337 A1 | 6/2009 | Yamazaki | |
| 2009/0170287 A1 | 7/2009 | Endo et al. | |
| 2010/0084734 A1 | 4/2010 | Momo et al. | |

FOREIGN PATENT DOCUMENTS

| | | |
|---|---|---|
| JP | 62-066000 | 3/1987 |
| JP | 01-135070 | 5/1989 |
| JP | 02-048495 | 2/1990 |

\* cited by examiner

*Primary Examiner* — Tu-Tu Ho
(74) *Attorney, Agent, or Firm* — Nixon Peabody LLP; Jeffrey L. Costellia

(57) ABSTRACT

An object is to provide a novel manufacturing method of a semiconductor substrate containing silicon carbide, and another object is to provide a semiconductor device using silicon carbide. A semiconductor substrate is manufactured through the steps of: adding ions to a silicon carbide substrate to form an embrittlement region in the silicon carbide substrate; bonding the silicon carbide substrate to a base substrate with insulating layers interposed therebetween; heating the silicon carbide substrate and separating the silicon carbide substrate at the embrittlement region to form a silicon carbide layer over the base substrate with the insulating layers interposed between therebetween; and performing heat treatment on the silicon carbide layer at a temperature of 1000° C. to 1300° C. to reduce defects of the silicon carbide layer. A semiconductor device is manufactured using the semiconductor substrate formed as described above.

18 Claims, 11 Drawing Sheets

METHOD FOR MANUFACTURING SEMICONDUCTOR SUBSTRATE, AND SEMICONDUCTOR DEVICE

BACKGROUND OF THE INVENTION

1. Field of the Invention

A technical field of the present invention relates to a method for manufacturing a semiconductor substrate, and a semiconductor device.

2. Description of the Related Art

It is known that silicon carbide as a semiconductor material is more advantageous than silicon in terms of increasing the withstand voltage of a semiconductor element (for example, a transistor), reducing a loss of electric power, or the like. Therefore, it is expected that silicon carbide is used for practical application of a transistor for electric power.

The cost of a silicon carbide substrate itself is the biggest problem for realizing a semiconductor element using silicon carbide. It is difficult to melt silicon carbide because of its characteristics; therefore, the silicon carbide substrate cannot be manufactured by a method having high productivity such as a Czochralski (CZ) method or the like which are used for manufacturing a silicon substrate. Therefore, a sublimation recrystallization method which is disadvantageous in terms of productivity has to be used for manufacturing a silicon carbide substrate for application of semiconductor (for example, see Patent Document 1 and Patent Document 2). The sublimation recrystallization method is a method in which a material is sublimated by heating and single-crystal silicon carbide is grown on seed crystal; therefore, there are problems in that a device in which the sublimation recrystallization method is performed at a very high temperature of 2000° C. to 3000° C. is needed and it is difficult to increase an area of the silicon carbide substrate.

Moreover, there is also a problem in that the silicon carbide substrate has defects called micropipes. The micropipes are hollow-core defects with a diameter of about 1 μm to 3 μm. If the micropipes exist in a semiconductor element, conductive defect occurs locally, and as a result, operation defect of a semiconductor element occurs. Other than the micropipes, there are also problems such as dislocation or the like.

After all, although a semiconductor element having a silicon carbide is expected to be high performance device, commercialization of the semiconductor element having a silicon carbide is delayed in practice due to low productivity and low quality of crystals.

[References]

[Patent Document 1] Japanese Published Patent Application No. S62-66000

[Patent Document 2] Japanese Published Patent Application No. H2-48495

SUMMARY OF THE INVENTION

In view of the foregoing problems, an object of one embodiment of the present invention disclosed in this specification and the like is to provide a novel manufacturing method of a semiconductor substrate containing silicon carbide. It is another object of the present invention to provide a semiconductor device using a silicon carbide.

One embodiment of the present invention disclosed in this specification and the like is a manufacturing method of a semiconductor substrate using a method for adding ions to a silicon carbide substrate and separating the silicon carbide substrate at the region where the ions are added.

Further, one embodiment of the present invention disclosed in this specification and the like is a semiconductor device manufactured using the semiconductor substrate formed as described above.

For example, a method for manufacturing a semiconductor substrate according to one embodiment of the invention includes the steps of adding ions to a silicon carbide substrate to form an embrittlement region in the silicon carbide substrate; bonding the silicon carbide substrate to a base substrate with insulating layers interposed therebetween; heating the silicon carbide substrate and separating the silicon carbide substrate at the embrittlement region to form a silicon carbide layer over the base substrate with the insulating layers interposed therebetween; and performing heat treatment on the silicon carbide layer at a temperature of 1000° C. to 1300° C. (preferably 1100° C. to 1250° C.) to reduce defects of the silicon carbide layer. Here, it is preferable that the insulating layers be formed by thermal oxidation treatment of the silicon carbide substrate.

In addition, a method for manufacturing a semiconductor substrate according to one embodiment of the invention is forming a high conductivity region on a surface of a silicon carbide substrate; adding ions to the silicon carbide substrate to form an embrittlement region in the silicon carbide substrate; bonding the silicon carbide substrate to a base substrate with insulating layers interposed therebetween; heating the silicon carbide substrate and separating the silicon carbide substrate at the embrittlement region to form the high conductivity region and a silicon carbide layer over the base substrate with the insulating layers interposed therebetween; and performing heat treatment on the silicon carbide layer at a temperature of 1000° C. to 1300° C. (preferably 1100° C. to 1250° C.) to reduce defects of the silicon carbide layer. Here, in the case where the high conductivity region is formed using material containing silicon, it is preferable that the insulating layers be formed by thermal oxidation treatment of the high conductivity region.

Further a semiconductor device according to one embodiment of the invention includes an insulating layer over a base substrate; a silicon carbide layer having a first region imparted with a first conductivity type, a second region in contact with the first region and imparted with a second conductivity type different from the first conductivity type, a third region in contact with the second region to be separated from the first region and imparted with the first conductivity type, and a fourth region in contact with the third region over the insulating layer; a first electrode in contact with the first region; a gate insulating layer over the silicon carbide layer; a second electrode overlapping with the second region over the gate insulating layer; and a third electrode in contact with the fourth region. Note that the high conductivity region may be a part of the silicon carbide layer.

In the above description, the fourth region is imparted with the first conductivity type and can be a higher conductivity region than the third region. Further in the above description, by imparting the second conductivity type to the fourth region, a semiconductor device operating differently is provided. In addition, a region having higher conductivity than the third region may be provided between the insulating layer and the silicon carbide layer.

Further a semiconductor device according to one embodiment of the invention includes an insulating layer over a base substrate; a high conductivity region over the insulating layer; a silicon carbide layer having a first region imparted with a first conductivity type, a second region in contact with the first region imparted with a second conductivity type different from the first conductivity type, and a third region in contact with the second region to be separated from the first region and imparted with the first conductivity type; a first electrode in contact with the first region; a gate insulating layer over the silicon carbide layer; a second electrode overlapping with the second region over the gate insulating layer; and a third electrode in contact with the high conductivity region. Note that the high conductivity region may be a part of the silicon carbide layer.

In the above description, the high conductivity region is imparted with the first conductivity type and has higher conductivity than the third region.

According to one embodiment of the disclosed invention, a semiconductor substrate having a silicon carbide layer is manufactured by thinning a silicon carbide substrate. Accordingly, a semiconductor substrate including a silicon carbide layer can be provided at very low cost. In addition, a silicon carbide substrate which is to be a silicon carbide layer can be used a plurality of times; therefore, manufacturing cost for a semiconductor substrate can be reduced sufficiently.

Since a semiconductor substrate having a silicon carbide layer over an insulating layer can be provided, characteristics of a semiconductor element can be improved by using this. A semiconductor device which withstands high voltages can be obtained by forming at least part of or all of the semiconductor elements using silicon carbide. By using such an element, a semiconductor device with excellent characteristics can be provided.

DETAILED DESCRIPTION OF THE INVENTION

Figure 1A:
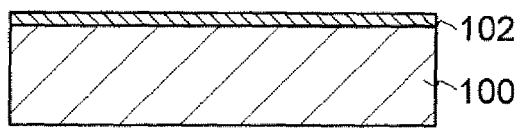
FIGS. 1A to 1G are cross-sectional views illustrating a method for manufacturing a semiconductor substrate.

Embodiments will be described below in detail with reference to the accompanying drawings. Note that the present invention is not limited to the description of the embodiments, and it is apparent to those skilled in the art that modes and details can be modified in various ways without departing from the spirit of the present invention disclosed in this specification and the like. In addition, structures in different embodiments can be implemented in combination appropriately. In structures of the invention described below, a reference numeral indicating the same portions and portions having a similar function is used in common throughout different drawings, and the repeated description is omitted.

[Embodiment 1]

This embodiment describes an example of a method for manufacturing a semiconductor substrate according to one embodiment of the disclosed invention with reference to FIGS. 1A to 1G.

<Processing of Base Substrate>

First, a base substrate 100 is prepared (see FIG. 1A). Although it is preferable to use a substrate with a high heat resistance, such as a quartz substrate, an alumina substrate, and a silicon substrate as the base substrate 100, a light-transmitting glass substrate used for liquid crystal display devices or the like can be used as long as the light-transmitting glass substrate can withstand heat. In this case, it is preferable to use a substrate having the strain point as high as possible. This embodiment describes the case where the silicon substrate is used as the base substrate 100.

Note that, as the base substrate 100, as well as the above substrate, a substrate which is formed with an insulator, such as a ceramic substrate or a sapphire substrate; a substrate which is formed with a semiconductor such as germanium or silicon germanium; a substrate which is formed with a conductor such as stainless steel; or the like can be used.

Next, an insulating layer 102 is formed over the base substrate 100 (see FIG. 1A). A method for forming the insulating layer 102 is not particularly limited to a certain method, and for example, a sputtering method, a plasma CVD method, or the like can be used. In addition, thermal oxidation treatment may be used for forming the insulating layer 102. The insulating layer 102 is a layer having a surface for bonding; therefore, the surface preferably has high planarity. The insulating layer 102 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, in the case where the insulating layer 102 is formed using silicon oxide, the insulating layer 102 which is extremely superior in planarity can be obtained by a chemical vapor deposition method with the use of an organosilane gas. Note that the insulating layer 102 may have a single-layer structure or a stacked layer structure.

Note that in this specification and the like, oxynitride refers to a substance that includes more oxygen (atoms) than nitrogen (atoms). For example, silicon oxynitride is a substance including oxygen, nitrogen, silicon, and hydrogen in ranges of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, nitride oxide refers to a substance that includes more nitrogen (atoms) than oxygen (atoms). For example, a silicon nitride oxide is a substance including oxygen, nitrogen, silicon, and hydrogen in ranges of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are obtained by measurement using Rutherford Backscattering Spectrometry (RBS) or Hydrogen Forward scattering Spectrometry (HFS). Moreover, the total of the percentages of the constituent elements does not exceed 100 at. %.

<Processing of Silicon Carbide Substrate>

Figure 1B:

Next, a silicon carbide substrate 110 is prepared (see FIG. 1B). A single-crystal substrate, a polycrystalline substrate, and the like are silicon carbide substrates, and any type of silicon carbide substrates can be used for the silicon carbide substrate. This embodiment describes the case where a single-crystal silicon carbide substrate is used as the silicon carbide substrate 110.

There is no limitation on the size or the shape of the silicon carbide substrate 110. For example, a circular silicon substrate can be processed into a rectangular shape for being used as the silicon carbide substrate 110. Note that in this specification and the like, the term "single-crystal" indicates a crystal which has a regular crystal structure and crystal axes oriented in the same direction in all portions of the crystal. Note that, it is not a matter of how many defects there are.

Figure 1C:

Next, by adding ions to the silicon carbide substrate 110, an embrittlement region 114 is formed (see FIG. 1C). More specifically, for example, an ion beam including ions accelerated by an electric field is delivered to form the embrittlement region 114 at a predetermined depth from a surface of the silicon carbide substrate 110. The depth of the region where the embrittlement region 114 is formed is controlled by the accelerating energy of the ion beam and the incidence angle of the ion beam. Note that, the embrittlement region 114 is formed in a region at a depth the same or substantially the same as the average penetration depth of the ions.

Depending on the depth at which the embrittlement region 114 is formed, the thickness of the semiconductor layer which is separated from the silicon carbide substrate 110 is determined. The depth where the embrittlement region 114 is formed is greater than or equal to 50 nm and less than or equal to 1 μm from the surface of the silicon carbide substrate 110, and is preferably greater than or equal to 50 nm and less than or equal to 300 nm.

At the time of adding ions to the silicon carbide substrate 110, an ion implantation apparatus or an ion doping apparatus can be used. In the ion implantation apparatus, a source gas is excited to produce ion species, the produced ion species are mass-separated, and an object to be processed is irradiated with the ion species having a predetermined mass. In the ion doping apparatus, a process gas is excited to produce ion species, the produced ion species are not mass-separated, and an object to be processed is irradiated with the produced ion species. Note that in an ion doping apparatus provided with a mass separator, ion irradiation with mass separation can also be performed as in the ion implantation apparatus.

In the case of using the ion doping apparatus, a step of forming the embrittlement region 114 can be performed, for example, under the following conditions:

Accelerating voltage is greater than or equal to 10 kV and less than or equal to 100 kV (preferably greater than or equal to 30 kV and less than or equal to 80 kV).

Dose is greater than or equal to $1 \times 10^{16}/cm^2$ and less than or equal to $4 \times 10^{16}/cm^2$.

Beam current intensity is greater than or equal to 2 μA/cm$^2$ (preferably greater than or equal to 5 μA/cm$^2$, more preferably greater than or equal to 10 μA/cm$^2$).

In the case of using the ion doping apparatus, a gas containing hydrogen can be used as a source gas. With the gas containing hydrogen, $H^+$, $H_2^+$, and $H_3^+$ can be produced as ion species. In the case where a hydrogen gas is used as the source gas, it is preferable to perform irradiation with a larger amount of $H_3^+$ ions. Specifically, it is preferable that the ion beam contains $H_3^+$ ions at a proportion of 70% or higher with respect to the total amount of $H^+$, $H_2^+$, and $H_3^+$ ions. It is more preferable that the proportion of $H_3^+$ ions be higher than or equal to 80%. By increasing the proportion of $H_3^+$ ions in this manner, the embrittlement region 114 can contain hydrogen at a concentration of higher than or equal to $1 \times 10^{20}$ atoms/cm$^3$. Accordingly, separation at the embrittlement region 114 can be performed easily. By irradiation with a larger amount of $H_3^+$ ions, the embrittlement region 114 can be formed in a shorter period of times as compared to the case of irradiation with $H^+$ ions and $H_2^+$ ions. Moreover, with the use of $H_3^-$, the average penetration depth of ions can be made shallower; thus, the embrittlement region 114 can be formed at a shallower region.

In the case of using the ion implantation apparatus, it is preferable to perform irradiation with $H_3^+$ ions through mass separation. Needless to say, irradiation with $H^+$ ions or $H_2^+$ ions may be performed. Note that, since ion species are selected to perform irradiation in the case of using the ion implantation apparatus, ion irradiation efficiency is decreased compared to the case of using the ion doping apparatus, in some cases.

As the source gas for the ion irradiation step, as well as the gas containing hydrogen, one or more kinds of gases selected from a rare gas such as helium or argon; a halogen gas typified by a fluorine gas or a chlorine gas; or a halogen compound gas such as a fluorine compound gas (for example, $BF_3$) can be used. When helium is used for the source gas, an ion beam with high proportion of $He^+$ ions can be formed without mass separation. By using such ion beams, the embrittlement region 114 can be efficiently formed.

Further, the embrittlement region 114 can also be formed by performing the ion irradiation step plural times. In this case, either different source gases or the same source gas may be used for the ion irradiation steps. For example, ion irradiation can be performed using a gas containing hydrogen as a source gas after ion irradiation is performed using a rare gas as a source gas. Alternatively, ion irradiation may be performed first using a halogen gas or a halogen compound gas, and then, ion irradiation may be performed using the gas containing hydrogen. Needless to say, ion irradiation is performed with a plurality of ions (such as $H^+$, $H_2^+$, $H_3^+$, and $He^+$) at one time by using a plurality of source gases (for example, a hydrogen gas, a helium gas and the like). In that case, there is an advantage in that separation is promoted without increasing the number of steps.

It is preferable that before the above ion irradiation step is performed, an insulating layer which functions as a protective insulating layer be formed on the surface of the silicon carbide substrate 110. Needless to say, it is also possible that the insulating layer is not provided; however, the insulating layer is preferably provided in order to suppress contamination of the silicon carbide substrate 110 and surface damage of the silicon carbide substrate 110 due to later ion irradiation. The thickness of the insulating layer is preferably greater than or equal to 10 nm and less than or equal to 400 nm. In addition, the description regarding the insulating layer can be referred to for the formation method, material, structure, and the like of the insulating layer 102. The insulating layer may be removed after the ion irradiation step, or may remain and used for bonding.

An insulating layer 116 is formed over the silicon carbide substrate 110 (see FIG. 1C). The description regarding the insulating layer 116 can be referred to for the formation method, material, structure, and the like of the insulating layer 102. In a manner similar to that of the insulating layer 102, the insulating layer 116 is a layer having a surface for bonding; therefore, the surface preferably has high planarity. Note that the insulating layer 116 does not need to be the same as the insulating layer 102. In addition, an insulating layer formed before the ion irradiation may be used as the insulating layer 116.

<Bonding of Base Substrate and Silicon Carbide Substrate>

Figure 1D:
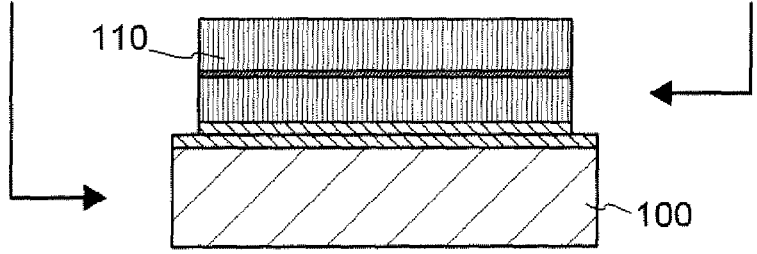

Then, the base substrate 100 and the silicon carbide substrate 110 are bonded to each other (see FIG. 1D). Specifically, the base substrate 100 and the silicon carbide substrate 110 are bonded to each other with the insulating layer 102 and the insulating layer 116 interposed therebetween. Note that the surfaces of the insulating layer 102 and the insulating layer 116 for bonding are preferably cleaned by an ultrasonic cleaning method or the like before the bonding.

After the surface of the insulating layer 102 is in contact with the surface of the insulating layer 116, pressure treatment is performed, so that the base substrate 100 and the silicon carbide substrate 110 are bonded to each other. As bonding mechanism, mechanism relating to van der Waals' force, mechanism relating to hydrogen bonding, or the like is conceivable.

Note that the surfaces for bonding may be subjected to oxygen plasma treatment or ozone treatment before bonding so that the surface may be hydrophilic. By this treatment, a hydroxyl is added to the surfaces for bonding so that a hydrogen bond can be formed at a bonding interface.

After the bonding, heat treatment may be performed on the base substrate 100 and the silicon carbide substrate 110 which are bonded to each other so as to strengthen the bonding. The heat temperature at this time needs to be a temperature that does not promote separation at the embrittlement region 114. For example, a temperature lower than 400° C., more preferably lower than or equal to 300° C. can be employed. There is no particular limitation on heat treatment time, and an optimal condition may be set as appropriate in accordance with a relation between heat treatment time and bonding force. For example, heat treatment can be performed at 200° C. for two hours. Note that only the region for bonding can be locally heated by irradiating the region used for bonding with microwaves or the like. When there is no problem with the bonding strength of the substrates, the heat treatment may be omitted.

<Separation of Silicon Carbide Substrate>

Figure 1E:
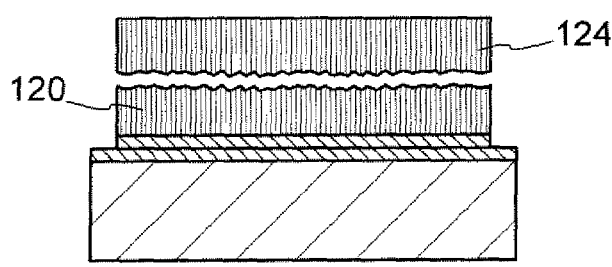
Figure 1F:
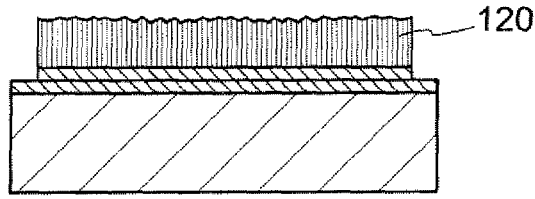

Next, the silicon carbide substrate 110 is separated into a silicon carbide layer 120 and a silicon carbide substrate 124 at the embrittlement region 114 (see FIG. 1E). The silicon carbide substrate 110 is separated by heat treatment. The temperature for the heat treatment can be set based on the upper temperature limit of the base substrate 100. For example, when a glass substrate is used as the base substrate 100, the temperature of the heat treatment is preferably equal to or higher than 400° C. and equal to or lower than the strain point of the glass substrate. Note that in this embodiment, heat treatment is performed at 600° C. for two hours.

By performing the above-described heat treatment, the volume of microvoids formed in the embrittlement region 114 is changed, and a crack is generated in the embrittlement region 114. As a result, separation of the silicon carbide substrate 110 is caused along the embrittlement region 114. Accordingly, the silicon carbide layer 120 separated from the silicon carbide substrate 110 is formed over the base substrate 100 (see FIG. 1F). Further, since the interface for bonding the insulating layer 102 to the insulating layer 116 is heated by this heat treatment, a covalent bond is formed at the interface for bonding, so that the bonding force between the insulating layer 102 and the insulating layer 116 can be further improved.

<Treatment for Silicon Carbide Layer>

Then, treatment for reducing the defects in the silicon carbide layer 120 or treatment for improving planarity of the surface of the silicon carbide layer 120 is performed. As the treatment for reducing the defects in the silicon carbide layer, for example, heat treatment at a temperature of 1000° C. to 1300° C. (preferably 1100° C. to 1250° C.), laser light irradiation treatment, or the like may be performed. As the treatment for improving planarity of the surface of the silicon carbide layer, etching treatment such as dry etching treatment or wet etching treatment, polishing treatment such as CMP, or the like may be performed.

Note that the above-mentioned heat treatment can be performed using a heat treatment apparatus such as a rapid thermal anneal (RTA), or a furnace, a millimeter wave heating apparatus, or the like. As a heating method of the heat treatment apparatus, a resistance heating method, a lamp heating method, a gas heating method, a radio wave heating method, or the like can be employed. The heat treatment may be performed by thermal plasma jet irradiation or the like.

In addition, a pulsed laser from which a high-energy laser light is easily obtained is preferably used for the above laser light irradiation treatment. The repetition rate is preferably about greater than or equal to 1 Hz and less than or equal to 10 MHz, more preferably greater than or equal to 10 Hz and less than or equal to 1 MHz. As oscillators of the above pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, or the like can be used. Note that the laser light is not limited to the pulsed laser, and a continuous-wave laser may be used. Example of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like. Note that a wavelength of the laser light is needed to be a wavelength which is absorbed into the silicon carbide layer 120.

Figure 1G:
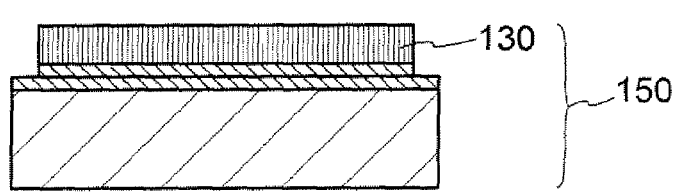

In the foregoing manner, a semiconductor substrate 150 including the silicon carbide layer 130 over the base substrate 100 can be manufactured (see FIG. 1G).

Note that in this embodiment, the case in which the insulating layer 102 formed on the base substrate 100 side and the insulating layer 116 formed on the silicon carbide substrate 110 side are bonded to each other is described; however, one embodiment of the disclosed invention disclosed herein is not limited thereto. For example, an insulating layer may be provided only on the base substrate 100 side or only on the silicon carbide substrate 110 side. In addition, in the case where the surfaces for bonding are sufficiently planarized, a structure without an insulating layer may be employed.

In addition, either the ion irradiation step for the silicon carbide substrate 110 (step of forming the embrittlement region 114) or the treatment for forming of the insulating layer 116 may be performed first.

As described above, according to one embodiment of the disclosed invention, a semiconductor substrate having a silicon carbide layer is manufactured by thinning a silicon carbide layer. Accordingly, a semiconductor substrate including a silicon carbide layer can be provided at very low cost. In addition, a silicon carbide substrate which is to be a silicon carbide layer can be used a plurality of times; therefore, manufacturing cost for a semiconductor substrate can be reduced sufficiently.

[Embodiment 2]

This embodiment describes another example of a method for manufacturing a semiconductor substrate according to one embodiment of the disclosed invention with reference to FIGS. 2A to 2G. Note that there are many common points between the method for manufacturing a semiconductor substrate in this embodiment and the method for manufacturing a semiconductor substrate, according to the aforementioned embodiment. Therefore, in this embodiment, a method for manufacturing a semiconductor substrate which is different from the method according to the aforementioned embodiment will be described.

Figure 2A:
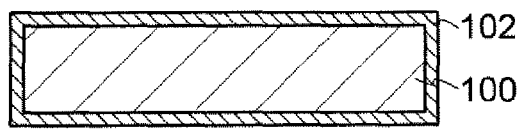
FIGS. 2A to 2G are cross-sectional views illustrating a method for manufacturing a semiconductor substrate.

First, a base substrate 100 is prepared and an insulating layer 102 is formed on the surface of the base substrate 100 (see FIG. 2A). Here, the case where a silicon substrate is used as the base substrate 100 and a silicon oxide formed by thermal oxidation treatment is used as the insulating layer 102 is especially described. Needless to say, one embodiment of the disclosed invention is not limited thereto. The aforementioned embodiment can be referred to for details thereof.

Figure 2B:
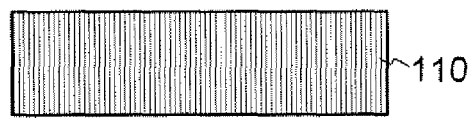
Figure 2C:
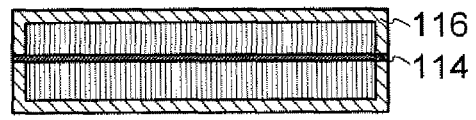
Figure 2D:
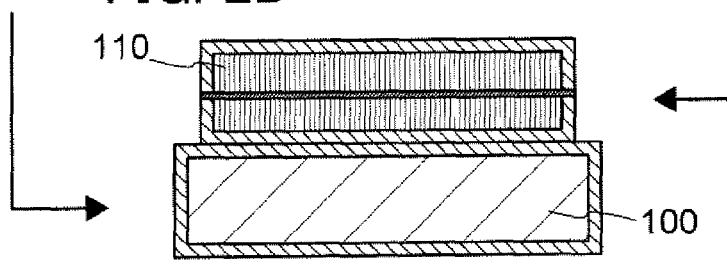
Figure 2E:
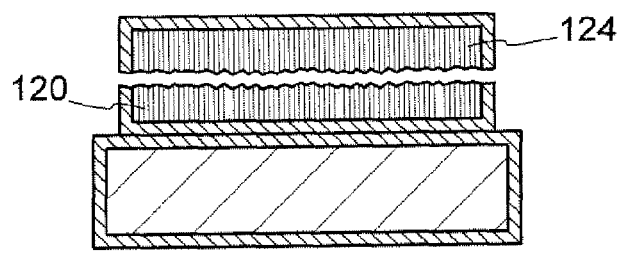
Figure 2F:
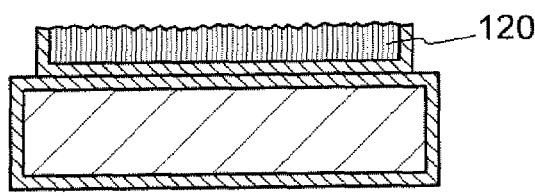
Figure 2G:
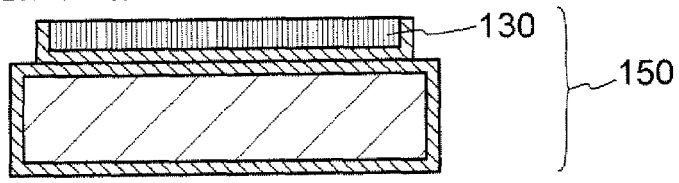

Next, by adding ions to the silicon carbide substrate 110, an embrittlement region 114 is formed, and an insulating layer 116 is formed on the surface of the silicon carbide substrate 110 (see FIGS. 2B and 2C). Here, the insulating layer 116 is formed by thermal oxidation treatment. That is, in this embodiment, the embrittlement region 114 is formed after the insulating layer 116 is formed in consideration of the temperature of heat treatment.

The condition of the thermal oxidation treatment for the silicon carbide substrate 110 can be set as appropriate, for example, the thermal oxidation treatment can be performed at a temperature of 1000° C. to 1200° C. in a dried oxygen atmosphere or an atmosphere containing water vapor. Note that mechanism of the thermal oxidation of silicon carbide is considered as composite mechanism of discharge process of carbon due to heat treatment and reaction process of silicon and oxygen. The insulating layer 116 which is extremely superior in planarity can be obtained due to this reaction mechanism.

Then, the base substrate 100 and the silicon carbide substrate 110 are bonded to each other (see FIG. 2D), the silicon carbide substrate 110 is separated along the embrittlement region 114 (see FIGS. 2E and 2F), and treatment for reducing defects and treatment for improving planarity of surfaces are performed on the silicon carbide layer 120. Thus, a semiconductor substrate 150 including the silicon carbide layer 130 over the base substrate 100 can be formed (see FIG. 2G). The aforementioned embodiment can be referred to for details of each step.

Note that in this embodiment, the case in which the insulating layer 102 is formed on the base substrate 100 side and the insulating layer 116 is formed on the silicon carbide substrate 110 side is described; however, one embodiment of the disclosed invention is not limited thereto. Note that since an insulating layer formed by thermal oxidation of silicon carbide has high planarity, the insulating layer formed by thermal oxidation of silicon carbide is preferably used as an insulating layer for bonding. Therefore, it is desirable for using the insulating layer formed by thermal oxidation of silicon carbide as far as possible.

This embodiment can be implemented in combination with any of the aforementioned embodiments, as appropriate.

[Embodiment 3]

This embodiment describes another example of a method for manufacturing a semiconductor substrate according to one embodiment of the disclosed invention with reference to FIGS. 3A to 3G. Note that there are many common points between the method for manufacturing a semiconductor substrate in this embodiment and the method for manufacturing a semiconductor substrate according to the aforementioned embodiment. Therefore, in this embodiment, a method for manufacturing a semiconductor substrate which is different from the methods according to the aforementioned embodiments will be described in detail.

Figure 3A:
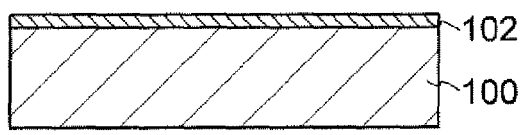
FIGS. 3A to 3G are cross-sectional views illustrating a method for manufacturing a semiconductor substrate.

First, a base substrate 100 is prepared and an insulating layer 102 is formed over the base substrate 100 (see FIG. 3A). The aforementioned embodiment can be referred to for details thereof.

Figure 3B:
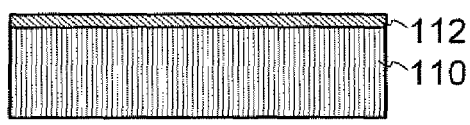

Next, a silicon carbide substrate 110 is prepared and high conductivity region 112 is formed over the silicon carbide substrate 110 (see FIG. 3B). Note that in this embodiment, the case a semiconductor layer to which conductivity is imparted is formed as the high conductivity region 112 is described; however, one embodiment of the disclosed invention is not limited thereto. For example, a conductive layer may be formed instead of the semiconductor layer to which conductivity is imparted. In addition, the high conductivity region 112 may be replaced with a layer having another function. For example, a semiconductor layer which is formed using materials different from silicon carbide and is not imparted with conductivity may be used.

A method for forming the high conductivity region 112 is not particularly limited to a certain method, and for example, a method for forming a high conductivity semiconductor layer using various deposition methods such as a CVD method, and a sputtering method, can be used. For example, a method for adding an impurity element imparting n-type conductivity such as phosphorus, or arsenic or an impurity element imparting p-type conductivity such as boron, or aluminum to source gas is used for a method for imparting conductivity. Needless to say, after a semiconductor layer is formed over the silicon carbide substrate 110, an impurity element may be added to the semiconductor layer by ion implantation or the like. Alternatively, the high conductivity region 112 may be formed by adding an impurity element directly to the silicon carbide substrate 110 by an ion implantation method or the like.

Figure 3C:
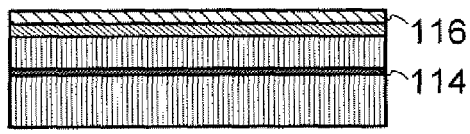
Figure 3D:
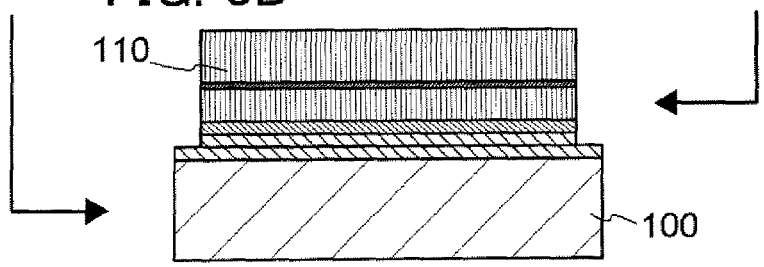
Figure 3E:
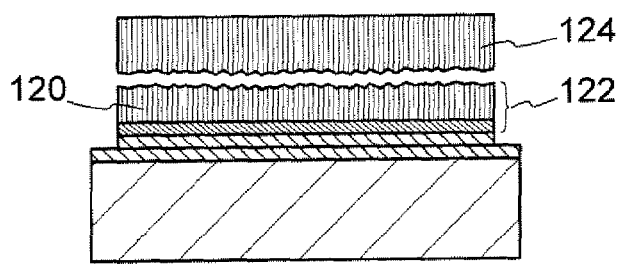
Figure 3F:
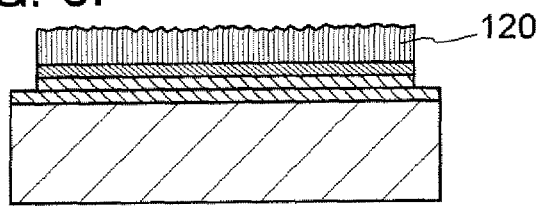
Figure 3G:
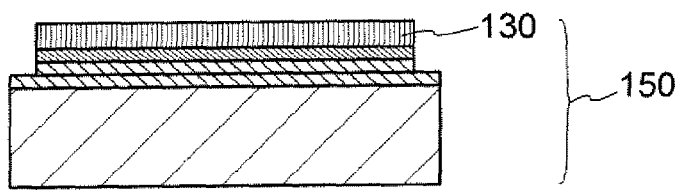

Next, by adding ions to the silicon carbide substrate 110, an embrittlement region 114 is formed, and an insulating layer 116 is formed on the surface of the silicon carbide substrate 110 (see FIG. 3C). The aforementioned embodiment can be referred to for details thereof.

Then, the base substrate 100 and the silicon carbide substrate 110 are bonded to each other (see FIG. 3D), the silicon carbide substrate 110 is separated along the embrittlement region 114 (see FIGS. 3E and 3F), and treatment for reducing defects and treatment for improving planarity of surfaces are performed on the silicon carbide layer 120. Thus, a semiconductor substrate 150 including the high conductivity region 112 and the silicon carbide layer 130 over the base substrate 100 can be formed (see FIG. 3G). The aforementioned embodiment can be referred to for details of each step.

Note that in this embodiment, the case in which the insulating layer 102 is formed on the base substrate 100 side and the insulating layer 116 is formed on the silicon carbide substrate 110 side is described; however, one embodiment of the disclosed invention is not limited thereto. Further, in this embodiment, an example in which the high conductivity region 112 is formed on the silicon carbide substrate 110 side is described; however, one embodiment of the disclosed invention is not construed as being limited thereto. Alternatively, a semiconductor layer to which conductivity is imparted or the like can be formed on the base substrate 100 side. In the case where the above described layers are formed over the base substrate 100 side, it is preferable to bond the base substrate 100 and the silicon carbide substrate 110 without forming the insulating layer 102 and the insulating layer 116 in order to utilize functions of these layers.

As described in this embodiment, various kinds of semiconductor elements can be realized by forming layers having various functions below a silicon carbide layer. For example, by forming a high conductivity region below a silicon carbide layer, a semiconductor element having a lower electrode can be formed. By employing such a structure, a semiconductor substrate, which includes a silicon carbide layer and can be used for various purposes, can be provided at low cost.

This embodiment can be implemented in combination with any of the aforementioned embodiments, as appropriate.
[Embodiment 4]

This embodiment describes an example of a semiconductor device using a semiconductor substrate described in aforementioned embodiments with reference to FIGS. 4A and 4B and 5A to 5D. Note that though it is preferable to use a semiconductor substrate formed by the step described in the above embodiment, a semiconductor substrate is not limited to this as long as the conditions are satisfied.
<Outline of Semiconductor Device>

Figure 4A:
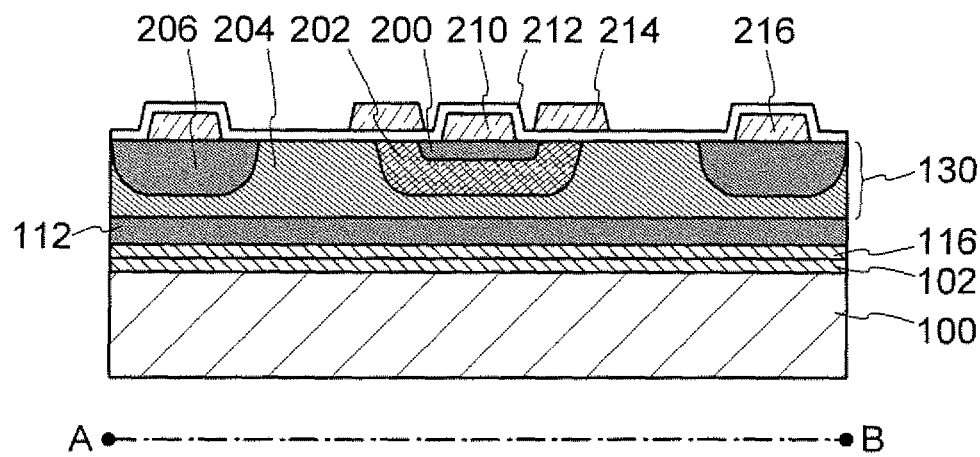
FIGS. 4A and 4B are a cross-sectional view and a plan view illustrating a structure of a semiconductor device.
Figure 4B:
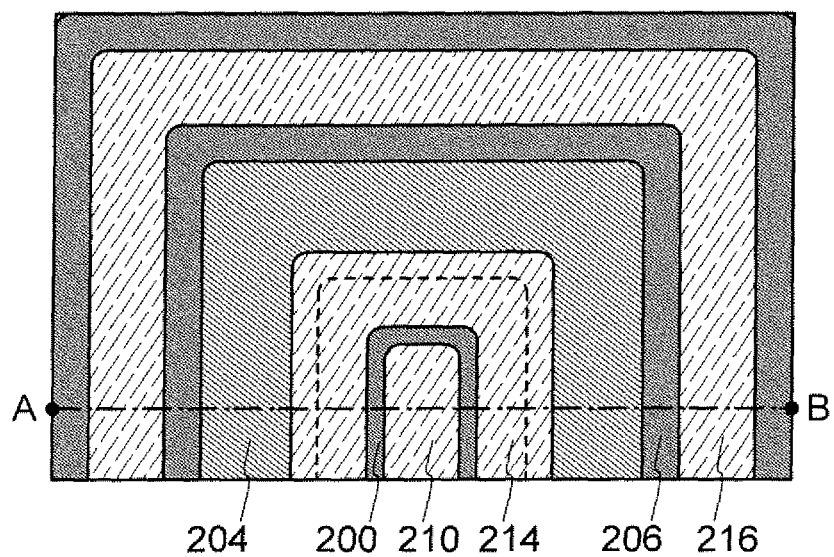

FIGS. 4A and 4B illustrate an example of structure of a semiconductor device. FIG. 4A is a cross-sectional view, and FIG. 4B is a plan view. FIG. 4A corresponds to a cross section along line A-B in FIG. 4B.

Over a base substrate 100, an insulating layer 102, an insulating layer 116, a high conductivity region 112, a silicon carbide layer 130 are provided in this order (see FIG. 4A). The silicon carbide layer 130 includes a first region 200 imparted with a first conductivity type, a second region 202 imparted with a second conductivity type which is different from the first conductivity type, a third region 204 imparted with the first conductivity type, and a fourth region 206 which is in contact with the third region 204. Here, the third region 204 is a region excluding the first region 200, the second region 202, and the fourth region 206 from the silicon carbide layer 130.

A first electrode 210 which functions as a source electrode (or a drain electrode) is provided in contact with the first region 200. A second electrode 214 which functions as a gate electrode is provided at a region overlapping with the second region 202 with a gate insulating layer 212 interposed therebetween. A third electrode 216 which functions as a drain electrode (or a source electrode) is provided in contact with a fourth region 206 (see FIG. 4A).

Note that when seen from the above, the second electrode 214 which functions as a gate electrode is provided in the periphery of the first electrode 210 which functions as a source electrode (or a drain electrode) and the third electrode 216 which functions as a drain electrode (or a source electrode) is provided in the periphery of the second electrode 214 (see FIG. 4B). In FIGS. 4A and 4B, although the semiconductor device has a structure in which the first electrode 210 is provided at the center of the semiconductor device and the second electrode 214 and the third electrode 216 are provided in the periphery of the first electrode 210, the structure of a semiconductor device is not limited to this.

The detail of a structure of a semiconductor device according to this embodiment is described below with reference to FIGS. 4A and 4B.
<Base Substrate>

A substrate having a flat surface such as an insulating substrate, a semiconductor substrate, or a metal substrate, can be employed as a base substrate 100. Note that it is preferable to use a substrate having a heat resistance for the base substrate 100.

In the case of using an insulating substrate, although it is preferable to use a quartz substrate in terms of a heat resistance, a glass substrate which has a strain point of 700° C. or higher can be used, for example.

A typical example of the semiconductor substrate is a silicon substrate (a silicon wafer). Although there are plural of grades in silicon substrates, an inexpensive silicon substrate may be used as long as it is a silicon substrate whose surface is polished to be flat. For example, a silicon substrate with about 6N purity (99.9999%) to 7N purity (99.99999%) can be used.

In the case of using a metal substrate, it is important to ensure sufficient planarity for the metal substrate.

Note that a substrate having conductivity such as a semiconductor substrate or a metal substrate has an effect of preventing concentration of electric field which is generated in a silicon carbide layer and improving the withstand voltage of an element. In addition, even in the case of using an insulating substrate, a similar effect can be obtained by providing a layer having conductivity below the silicon carbide layer 130.
<Insulating Layer Over Base Substrate>

It is preferable that the insulating layer 102 and the insulating layer 116 which are provided over the base substrate 100 have high planarity. As the insulating layer, a silicon oxide layer, a silicon oxynitride layer, a silicon nitride layer, or the like which is formed by a sputtering method, a vapor deposition method, or the like can be used.

In the case of using a silicon substrate or the like as the base substrate 100, an insulating layer formed by a thermal oxidation method may be used as the insulating layer 102. For example, when the silicon substrate is at a solar cell level, it is preferable to form an insulating layer (an oxide film) which includes a halogen element such as chlorine by a thermal oxidation method because capturing effect for an impurity element can be obtained. For example, the insulating layer can be formed by heat treatment at a temperature of 700° C. to 1150° C. (preferably 800° C. to 1050° C.) in an oxidation atmosphere containing hydrogen chloride at 0.5 vol. % to 10 vol. % (preferably 3 vol. %).

Similarly, the insulating layer 116 can be formed by a thermal oxidation method. Especially, in the case where thermal oxidation is performed on silicon carbide, the thermal oxidation method is preferable because the insulating layer 116 having high planarity is obtained easily.

Note that one of the insulating layer 102 and the insulating layer 116 may be omitted in accordance with characteristics, applications, and the like of a required semiconductor device.
<Silicon Carbide Layer>

The silicon carbide layer 130 formed over the base substrate 100 with the insulating layer 102 and the insulating layer 116 interposed therebetween is preferably in a single-crystal state, but may be in a polycrystalline state. The thickness of the silicon carbide layer 130 may be about 50 nm to 1 μm.

At the high conductivity region 112, an impurity element added to a part of the silicon carbide layer 130, or a conductive layer or a semiconductor layer to which conductivity is imparted may be separately formed.
<First Region>

The first region 200 is a region to which a first conductivity type is imparted. The first conductivity type may be an n-type or a p-type.

When seen from the above, the first region 200 is formed so as to overlap with a first electrode 210 which functions as a source electrode (or a drain electrode) (see FIG. 4B). in addition, the peripheral portion of the first region 200 may be overlapped with a second electrode 214 which functions as a gate electrode.

The depth direction of the first region 200 is required not to reach the high conductivity region 112 (see FIG. 4A).
<Second Region>

The second region 202 is provided outside the first region 200 and imparted with a second conductivity type which is different from the first conductivity type. That is, in the case where the first conductivity type is an n-type, the second conductivity type is a p-type and in the case where the first conductivity type is a p-type, the second conductivity type is an n-type.

When seen from the above, the second region 202 is formed so as to cover the outer circumference of the first region 200. In addition, the second region 202 is formed so as to overlap with a second electrode 214 which functions as a gate electrode (see FIG. 4B).

The second region 202 reaches a region deeper than the first region 200 in the depth direction (see FIG. 4A). Accordingly, when voltage is not applied the second electrode 214 which functions as a gate electrode to turn on the second electrode 214, insulation between the first electrode 210 which functions as a source electrode (or a drain electrode) and the third electrode 216 which functions as a drain electrode (or a source electrode) is secured.

<Third Region>

The third region 204 is a region to which a first conductivity type is imparted. The third region 204 is formed in almost entire region of the silicon carbide layer 130. The third region 204 functions as a current path. Note that the first region 200 and the third region 204 are separated from each other by the second region 202.

<Fourth Region>

The fourth region 206 is a region to which a first conductivity type is imparted. Note that it is preferable that an impurity element is added to the fourth region 206 at a concentration higher than that of the third region 204 in order to realize ohmic contact between the fourth region 206 and the third electrode 216; however, one embodiment of the disclosed invention is not limited thereto. The fourth region 206 may be the same as the third region 204.

When seen from the above, the fourth region 206 is formed so as to overlap with the third electrode 216 which functions as a drain electrode (or a source electrode) (see FIG. 4B).

<Gate Insulating Layer>

The gate insulating layer 212 is formed by a method for oxidizing the silicon carbide layer 130 or a method for depositing an insulating material.

As the method for oxidizing the silicon carbide layer 130, a dry oxidation method which is performed in a dried oxygen atmosphere, a pyrogenic oxidation method (a wet oxidation method) which is performed in an atmosphere containing water vapor, an HCl oxidation method in which hydrogen chloride is mixed with oxygen, or the like can be employed. Alternatively, a plasma oxidation method may be employed for forming the gate insulating layer 212. The plasma oxidation method has a feature that oxygen radicals generated in plasma react with a semiconductor surface and oxidation reaction proceeds even at low temperatures.

As the method for depositing an insulating material, a method for forming silicon oxide, silicon oxynitride, or the like by a thermal CVD method or a plasma CVD method can be employed.

<First Electrode and Third Electrode>

The first electrode 210 is formed in contact with the first region 200. The third electrode 216 is formed in contact with the fourth region 206. In a case where a first conductivity type is an n-type, the first electrode 210 which functions as a source electrode is negatively biased and the third electrode 216 which functions as a drain electrode is positively biased while the semiconductor device is normally operated.

<Second Electrode>

The second electrode 214 which functions as a gate electrode is insulated from the first region 200, the second region 202, the third region 204, and the fourth region 206 by being provided over the gate insulating layer 212. An upper portion of the second electrode 214 is preferably covered with an insulating layer. Insulation of the second electrode 214 from the first electrode 210 and the third electrode 216 can be secured by the insulating layer.

<Operation of Semiconductor Device>

In the case where the first region 200 has an n-type conductivity, the second region 202 has a p-type conductivity, and the third region 204 and the fourth region 206 have n-type conductivity, an npn junction is formed between the first electrode 210 which functions as a source electrode and the third electrode 216 which functions as a drain electrode. Accordingly, when bias is not applied to the second electrode 214 which functions as a gate electrode, only a small amount of current flows.

When positive bias is applied to the second electrode 214, negative charges (electrons) are induced near the interface with the gate insulating layer 212 in the second region 202 which overlaps with the second electrode 214, and the interface with the gate insulating layer 212 in the second region 202 becomes a channel, whereby current flows between the first electrode 210 and the third electrode 216.

In one embodiment of the disclosed invention, since channel is formed in the silicon carbide layer 130, breakdown voltage of a transistor is improved. This is because, in a Si—C bond, the interatomic distance is as small as about 0.18 nm, the bond energy is high, and an energy gap of silicon carbide is about three times that of silicon.

Further, in the case where channel is formed in the silicon carbide layer 130, specific on resistance can be about 2 digits smaller than that of the case where channel is formed in the silicon. In addition, since silicon carbide has a thermal conductivity approximately three times as high as silicon, heat can be dissipated efficiently. Thus, current in the semiconductor device can be increased.

<Modification Example>

The semiconductor device shown in the FIGS. 4A and 4B can be operated differently from the above by changing the structure slightly. For example, a conductivity type of the fourth region 206 can be the same as that of the second region 202. In this case, the first electrode 210 which is in contact with the first region 200 is called an emitter electrode and the third electrode 216 which is in contact with the fourth region 206 is called a collector electrode.

In this structure, when positive bias is applied to the second electrode 214 which functions as a gate electrode, channel is formed in the second region 202, whereby current flows therebetween. Here, since the fourth region 206 has a p-type conductivity, charges (holes) in the fourth region 206 are injected into the high conductivity region 112 in an On state. Accordingly, voltage in an On state can be lowered.

The semiconductor device has a structure of an insulated-gate field effect transistor on an input side and a structure of a bipolar transistor on an output side. Therefore, the semiconductor device is driven with a voltage between the second electrode 214 which functions as a gate electrode and the first electrode 210 which functions as an emitter electrode, and can be turned on or off by input signals to the second electrode 214. By the structure, switching operation can be faster, and self-heating is suppressed due to low on resistance, whereby control of a large amount of electrical power can be facilitated.

<Manufacturing Process>

A manufacturing process of the semiconductor device shown in FIGS. 4A and 4B will be described with reference to FIGS. 5A to 5D.

Figure 5A:
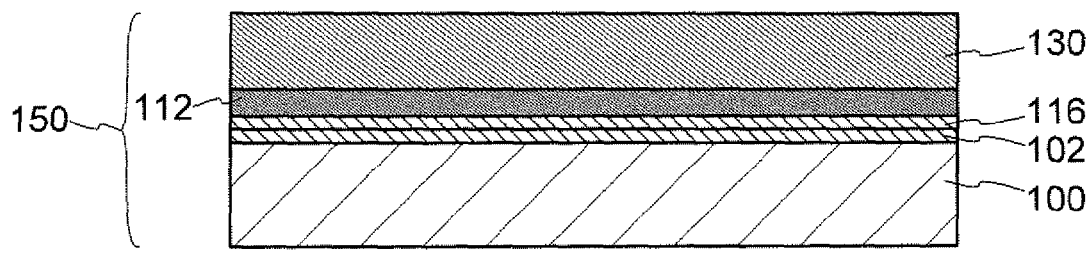
FIGS. 5A to 5D are cross-sectional views illustrating a method for manufacturing a semiconductor device.

First, a semiconductor substrate 150 is obtained in accordance with a method described in aforementioned embodiments (for example, the method described in Embodiment 3) or the like (see FIG. 5A). The semiconductor substrate 150 has a structure in which the insulating layer 102, the insulating layer 116, the high conductivity region 112, and the silicon carbide layer 130 are formed in this order over the base substrate 100. In addition, an impurity element imparting the first conductivity type is added to the silicon carbide layer 130.

As an impurity element which can be added to the silicon carbide layer 130, phosphorus (P) or arsenic (As) which imparts n-type conductivity, and boron (B) or aluminum (Al) which imparts p-type conductivity, and the like can be employed. Here, the case of imparting n-type conductivity by adding phosphorus (P) will be described. That is, the first conductivity type is an n-type here.

Note that this embodiment employs a structure in which the high conductivity region 112 is provided under an entire bottom surface of the silicon carbide layer 130; however, one embodiment of the disclosed invention is not limited thereto and may employ a structure in which the high conductivity region 112 is provided selectively.

Figure 5B:
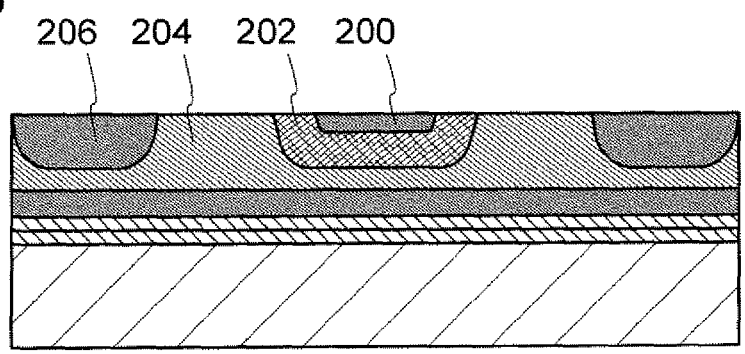

Next, an impurity element imparting p-type conductivity (for example, boron) and an impurity element imparting n-type conductivity (for example, phosphorus) are selectively added to the silicon carbide layer 130, thereby forming the first region 200 imparted with the first conductivity type, the second region 202 imparted with a conductivity type which is different from the first conductivity type and the fourth region 206 imparted with the first conductivity type (see FIG. 5B). Accordingly, the region in the silicon carbide layer 130, other than the first region 200, the second region 202, and the fourth region 206 becomes the third region 204. Here, part of the second region 202 functions as a channel formation region, the first region 200 functions as a source region (or a drain region), and the fourth region 206 functions as a drain region (or a source region) later. Note that it is preferable that an impurity concentration of the first region 200 is higher than that of the third region 204.

Figure 5C:
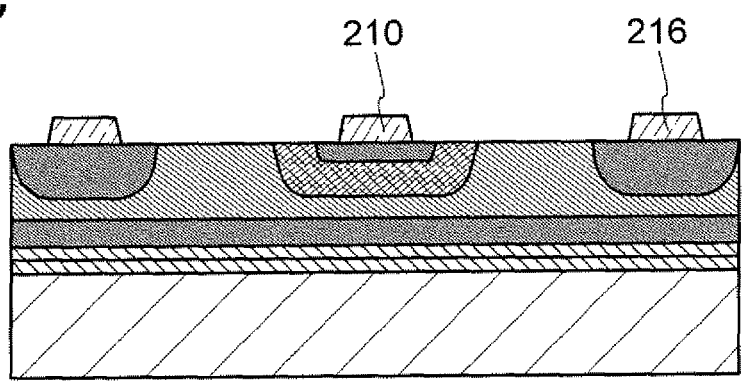

After forming the first region 200, the second region 202, the third region 204, and the fourth region 206, the first electrode 210 is selectively formed so as to be in contact with the first region 200 and the third electrode 216 is selectively formed so as to be in contact with the fourth region 206 (see FIG. 5C). Here, the first electrode 210 functions as a source electrode (or a drain electrode) and the third electrode 216 functions as a drain electrode (or a source electrode).

A material having high heat resistance is preferably used as the first electrode 210 and the third electrode 216. For example, titanium, molybdenum, tungsten, tantalum, chromium, nickel, or the like can be used. Alternatively, a material having low resistance, such as aluminum and copper may be used. Further, a semiconductor material (for example, polysilicon) to which an impurity element imparting a conductivity type is added may be used.

Figure 5D:
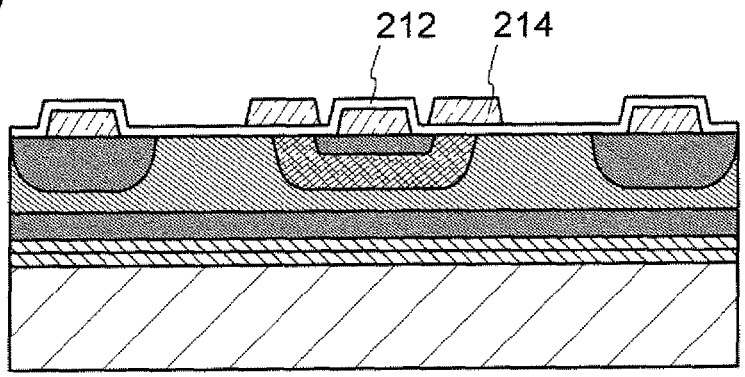

Then, the gate insulating layer 212 is formed so as to cover the silicon carbide layer 130, the first electrode 210, and the third electrode 216, and the second electrode 214 which functions as a gate electrode is selectively formed over the gate insulating layer 212 (see FIG. 5D). Here, it is preferable to form the second electrode 214 so that part of the second electrode 214 overlaps with the first region 200. Thus, the concentration of electric field is alleviated, whereby higher withstand voltage can be obtained. After that, an insulating layer may be formed so as to cover the second electrode 214.

The gate insulating layer 212 can be formed using a material, such as silicon oxide, silicon nitride, silicon oxynitride, silicon nitride oxide, hafnium oxide, aluminum oxide, and tantalum oxide. As a manufacturing method, a thermal oxidation method (a thermal nitridation method), a plasma CVD method, a sputtering method, a method using oxidation or nitridation by high density plasma treatment, and the like can be employed.

The second electrode 214 can be formed in a manner similar to those of the first electrode 210 and the third electrode 216.

As described above, a semiconductor device for electric power which is a so-called power MOSFET can be manufactured. As described in this embodiment, increasing the withstand voltage of a semiconductor element, reducing a loss of electric power, and the like can be realized by using silicon carbide for a power MOSFET. According to one embodiment of the disclosed invention, a semiconductor substrate containing silicon carbide can be provided at very low cost; therefore, manufacturing cost of a semiconductor element and a semiconductor device can be reduced.

This embodiment can be implemented in combination with any of the aforementioned embodiments, as appropriate.

[Embodiment 5]

This embodiment describes another example of a semiconductor device using a semiconductor substrate manufactured by a method described in any of aforementioned embodiments with reference to FIGS. 6A to 6B and FIGS. 7A to 7D.

<Outline of Semiconductor Device>

Figure 6A:
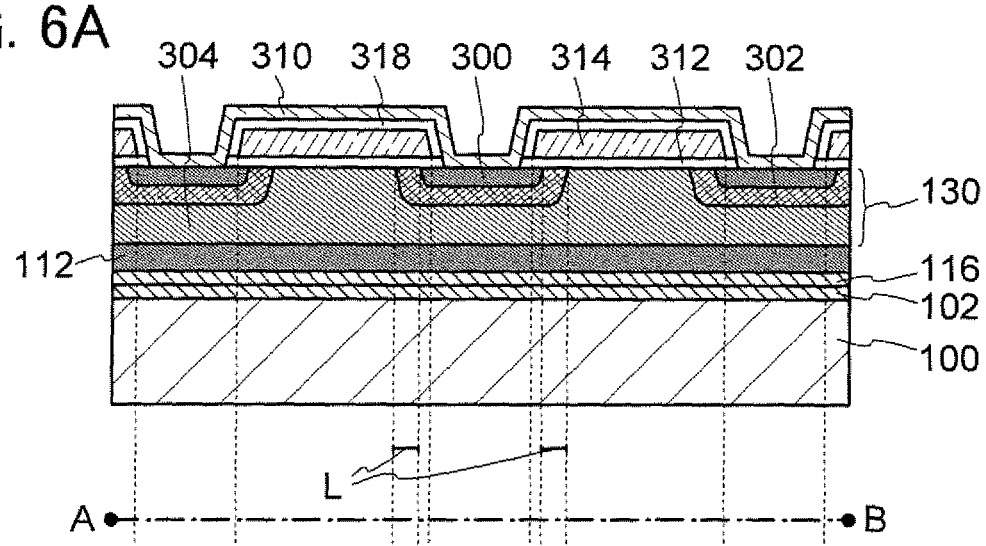
FIGS. 6A and 6B are a cross-sectional view and a plan view illustrating a structure of a semiconductor device.
Figure 6B:
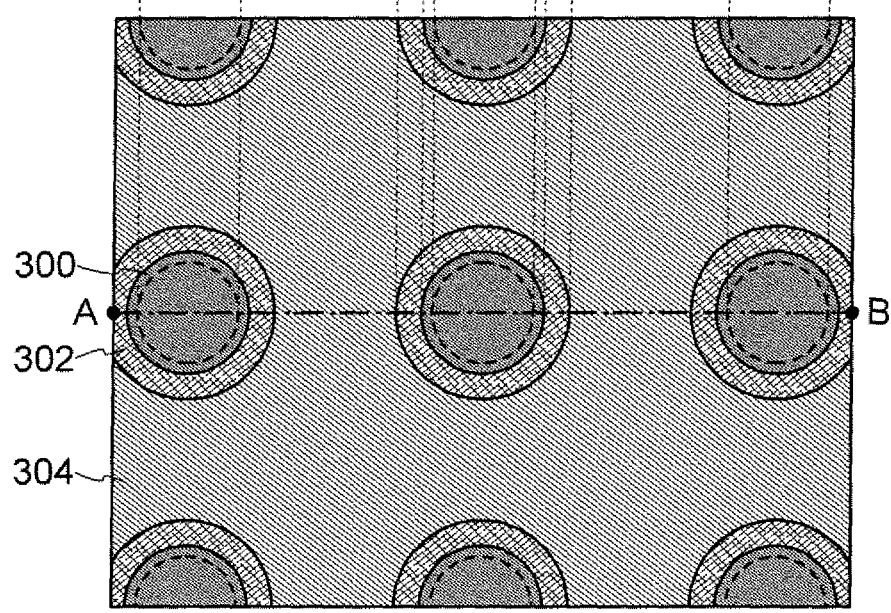

FIGS. 6A and 6B illustrate an example of a structure of a semiconductor device. FIG. 6A is a cross-sectional view, and FIG. 6B is a plan view. FIG. 6A corresponds to a cross section along line A-B in FIG. 6B.

An insulating layer 102, an insulating layer 116, a high conductivity region 112, and a silicon carbide layer 130 are provided in this order over a base substrate 100 (see FIG. 6A). The silicon carbide layer 130 includes a first region 300 imparted with a first conductivity type, a second region 302 imparted with a second conductivity type which is different from the first conductivity type, and a third region 304 imparted with the first conductivity type. Here, the third region 304 is a region in the silicon carbide layer 130, other than the first region 300 and the second region 302.

A conductive layer 310 which functions as a source electrode (or a drain electrode) is formed in contact with the first region 300. A conductive layer 314 which functions as a gate electrode is provided in a region which overlaps with the second region 302 with a gate insulating layer 312 interposed therebetween. In addition, the high conductivity region 112 functions as a drain electrode (or a source electrode) (see FIG. 6A). The high conductivity region 112 is connected to another electrode (or wirings) at a region which is not shown and signals are extracted to the outside therethrough. The semiconductor device described in this embodiment has a feature that the current flows to the depth direction of the silicon carbide layer 130.

Note that, the planar shape of the first region 300 and the second region 302 is a concentric shape (see FIG. 6B) in the semiconductor device described in this embodiment; however, an embodiment of the disclosed invention is not limited thereto. Either a rectangular shape or any other shape can be employed. As described in this embodiment, by forming the first region 300 and the second region 302 in a concentric shape, variations in a channel length L can be suppressed. Accordingly, the concentration of the electric field in the channel formation region can be alleviated, whereby the transistor can have higher withstand voltage.

<Manufacturing Process>

A manufacturing process of the semiconductor device shown in FIGS. 6A and 6B will be described with reference to FIGS. 7A to 7D.

Figure 7A:
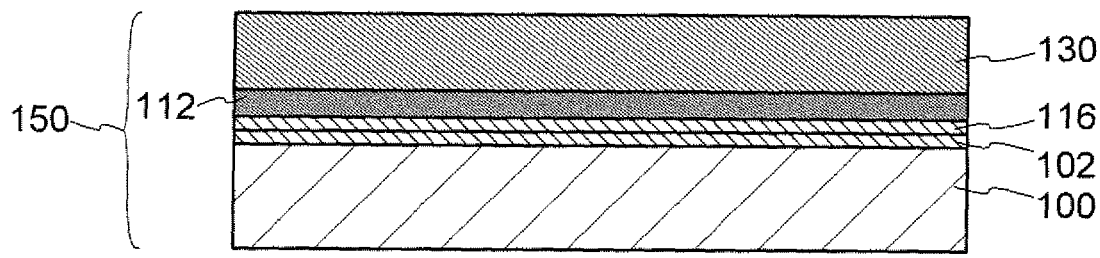
FIGS. 7A to 7D are cross-sectional views illustrating a method for manufacturing a semiconductor device.

First, a semiconductor substrate 150 manufactured by the method described in any of aforementioned embodiments is prepared (see FIG. 7A). The semiconductor substrate 150 has a structure in which the insulating layer 102, the insulating layer 116, the high conductivity region 112, and the silicon carbide layer 130 are provided in this order over the base substrate 100. In addition, an impurity element imparting the first conductivity type is added to the silicon carbide layer 130.

As an impurity element which can be added to the silicon carbide layer 130, phosphorus (P) or arsenic (As) which imparts n-type conductivity, and boron (B) or aluminum (Al) which imparts p-type conductivity, and the like can be employed. Here, the case of imparting n-type conductivity by adding phosphorus (P) will be described. That is, the first conductivity type is an n-type here.

Note that this embodiment employs a structure in which the high conductivity region 112 is provided under an entire bottom surface of the silicon carbide layer 130; however, one embodiment of the disclosed invention is not limited thereto and may employ a structure in which the high conductivity region 112 is provided selectively.

Figure 7B:
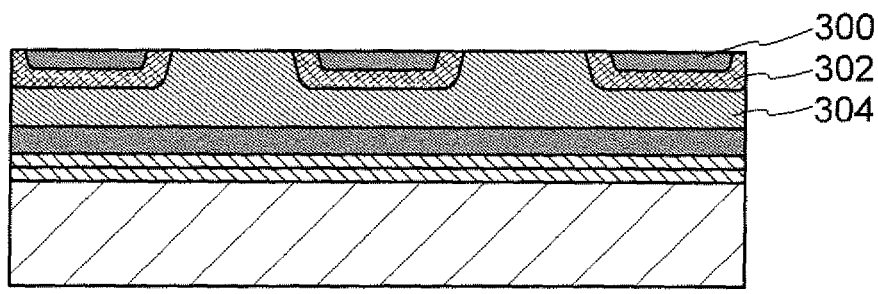
Figure 7C:
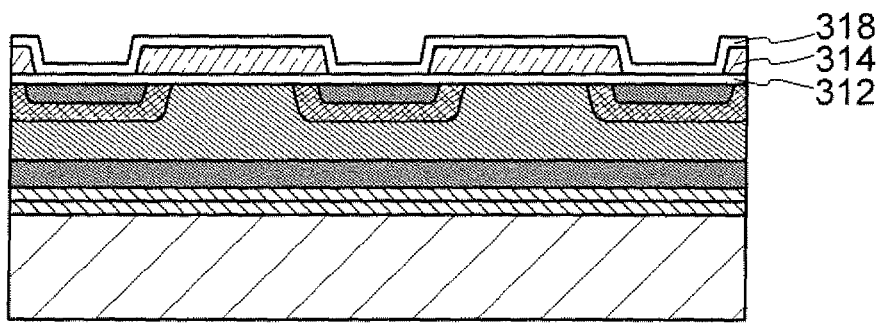

Next, an impurity element imparting p-type conductivity (for example, boron) and an impurity element imparting n-type conductivity (for example, phosphorus) are selectively added to the silicon carbide layer 130, thereby forming the first region 300 imparted with the first conductivity type and the second region 302 imparted with a conductivity type which is different from the first conductivity type (see FIG. 7B). Accordingly, the region in the silicon carbide layer 130, other than the first region 300 and the second region 302 becomes the third region 304. Here, part of the second region 302 functions as a channel formation region, and the first region 300 functions as a source region (or a drain region) later.

After forming the first region 300, the second region 302, and the third region 304, the gate insulating layer 312 is formed over the second region 302 and the conductive layer 314 which functions as a gate electrode is selectively formed over the gate insulating layer 312. Then, an insulating layer 318 is formed so as to cover the conductive layer 314 (see FIG. 7C). Here, it is preferable that the conductive layer 314 be formed so as to be overlapped with the second region 302. Thus, the concentration of electric field is alleviated, whereby higher withstand voltage of the semiconductor device can be obtained.

The gate insulating layer 312 can be formed using a material, such as silicon oxide, silicon nitride, silicon oxynitride, silicon nitride oxide, hafnium oxide, aluminum oxide, and tantalum oxide. As a manufacturing method, a thermal oxidation method (a thermal nitridation method), a plasma CVD method, a sputtering method, a method using oxidation or nitridation by high density plasma treatment, or the like can be employed. Although the insulating layer 318 can be formed in a manner similar to that of the gate insulating layer 312, a material different from that of the gate insulating layer 312 may be used. For example, the insulating layer 318 can be formed by using an organic material.

A material having high heat resistance is preferably used as the conductive layer 314. For example, titanium, molybdenum, tungsten, tantalum, chromium, nickel, or the like can be used. Alternatively, a material having low resistance, such as aluminum and copper may be used. Further, a semiconductor material (for example, polysilicon) to which an impurity element imparting a conductivity type is added may be used.

Note that in this embodiment, the case in which the gate insulating layer 312 is formed after the first region 300, the second region 302, and the third region 304 are formed is described; however, one embodiment of the disclosed invention is not construed as being limited thereto. For example, the first region 300, the second region 302, and the third region 304 may be formed after the gate insulating layer 312 is formed. Alternatively, an insulating layer which serves as the gate insulating layer 312 may be formed in manufacturing steps of the semiconductor substrate.

Figure 7D:
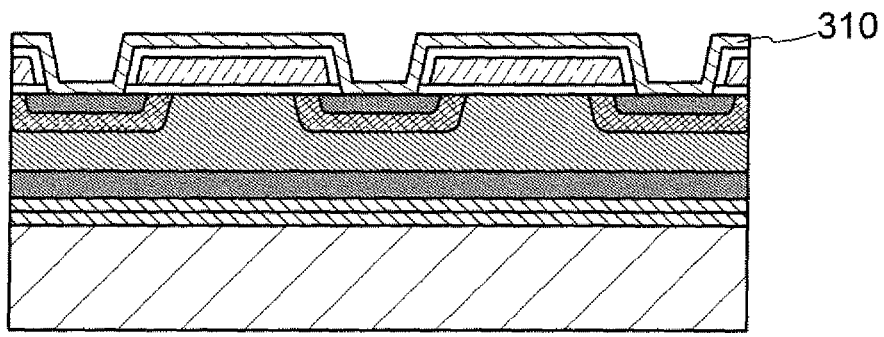

Next, the conductive layer 310 which is electrically connected to the first region 300 is formed after a contact hole is formed in the gate insulating layer 312 and the insulating layer 318 (see FIG. 7D). Note that the conductive layer 310 functions as a source region (or a drain region).

The contact hole which is formed in the gate insulating layer 312 and the insulating layer 318 can be formed by selective etching with the use of a resist mask or the like. In addition, the conductive layer 310 may be formed in a manner similar to that of the conductive layer 314 and the like.

Note that when the above contact hole is formed, a contact hole which reaches the high conductivity region 112 is formed in part of the third region 304 and a conductive layer which is electrically connected to the high conductivity region 112 is formed in a manner and a material similar to those of the conductive layer 310, whereby the conductive layer may be used as a signal extraction electrode (or wirings) (not shown).

As described above, a semiconductor device for electric power which is a so-called power MOSFET can be manufactured. As described in this embodiment, increasing the withstand voltage of a semiconductor element, reducing a loss of electric power, and the like can be realized by using silicon carbide for a power MOSFET. According to one embodiment of the disclosed invention, a semiconductor substrate containing silicon carbide can be provided at very low cost; therefore, manufacturing cost of a semiconductor element and a semiconductor device can be reduced.

This embodiment can be implemented in combination with any of the aforementioned embodiment, as appropriate.

[Embodiment 6]

This embodiment describes another example of a semiconductor device using a semiconductor substrate manufactured by a method described in any of the aforementioned embodiments with reference to FIGS. 8A to 8B and FIGS. 9A to 9D.

<Outline of Semiconductor Device>

Figure 8A:
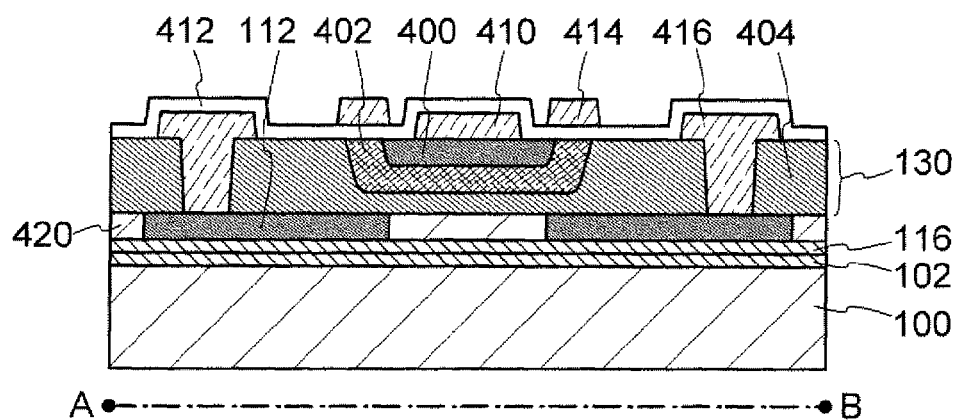
FIGS. 8A and 8B are a cross-sectional view and a plan view illustrating a structure of a semiconductor device.
Figure 8B:
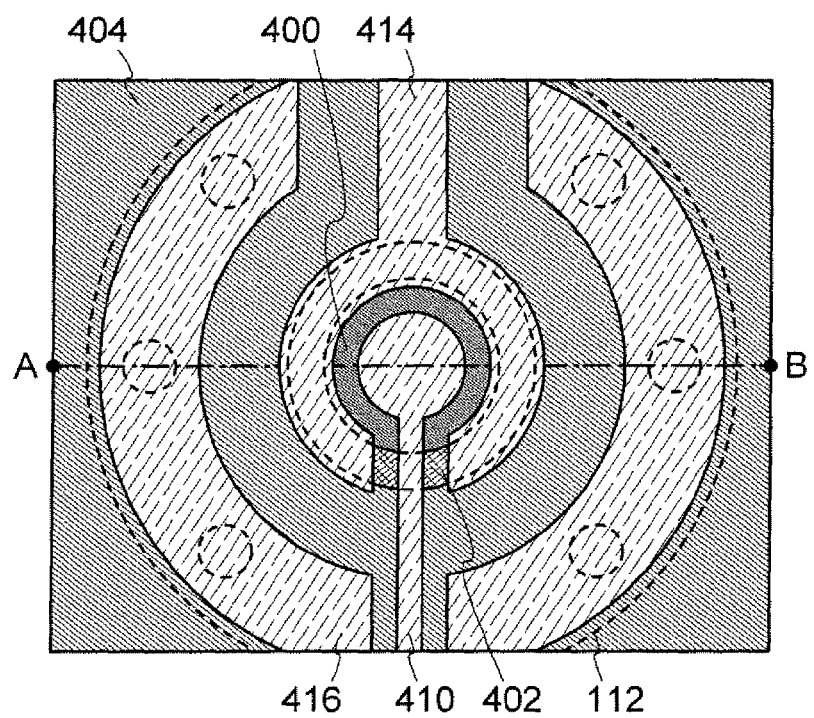

FIGS. 8A and 8B illustrate an example of a structure of a semiconductor device. FIG. 8A is a cross-sectional view, and FIG. 8B is a plan view. FIG. 8A corresponds to a cross section along line A-B in FIG. 8B.

An insulating layer 102, an insulating layer 116, a semiconductor layer 420, and a silicon carbide layer 130 are provided in this order over a base substrate 100 (see FIG. 8A). Here, a high conductivity region 112 is formed partly in the semiconductor layer 420. The silicon carbide layer 130 includes a first region 400 imparted with a first conductivity type, a second region 402 imparted with a second conductivity type which is different from the first conductivity type, and a third region 404 imparted with the first conductivity type. The third region 404 is a region in the silicon carbide layer 130, other than the first region 400 and the second region 402.

A first electrode 410 which functions as a source electrode (or a drain electrode) is formed in contact with the first region 400. A second electrode 414 which functions as a gate electrode is provided in a region which overlaps with the second region 402 with a gate insulating layer 412 interposed therebetween. In addition, the high conductivity region 112 and a third electrode 416 which is connected thereto function as a drain electrode (or a source electrode) (see FIG. 8A).

Note that, the planar shape of the first region 400 and the second region 402 is a concentric shape (see FIG. 8B) in the semiconductor device described in this embodiment. In addition, the first electrode 410, the second electrode 414, and the third electrode 416 are formed so as to correspond thereto. As described in this embodiment, by forming the first region 400 and the second region 402 in a concentric shape, variations in a channel length L can be suppressed. Accordingly, the concentration of the electric field in the channel formation region can be alleviated, whereby the transistor can have higher withstand voltage.

Note that in a structure described in this embodiment, the first electrode 410, the second electrode 414, and the third electrode 416 are not intersected with each other; however, one embodiment of the disclosed invention is not limited thereto. Since the first electrode 410 and the second electrode 414, or the second electrode 414 and the third electrode 416 are separated by the gate insulating layer 412 respectively, operation of the semiconductor device can be secured even in the case where the first electrode 410 and the second electrode 414, or the second electrode 414 and the third electrode 416 are intersected with each other. Note that carriers flow through the first electrode 410, the first region 400, the second region 402, the third region 404, the high conductivity region 112, and the third electrode 416 in this order (or in the reverse order thereof).

<Manufacturing Process>

A manufacturing process of the semiconductor device shown in FIGS. 8A and 8B will be described with reference to FIGS. 9A to 9D.

Figure 9A:
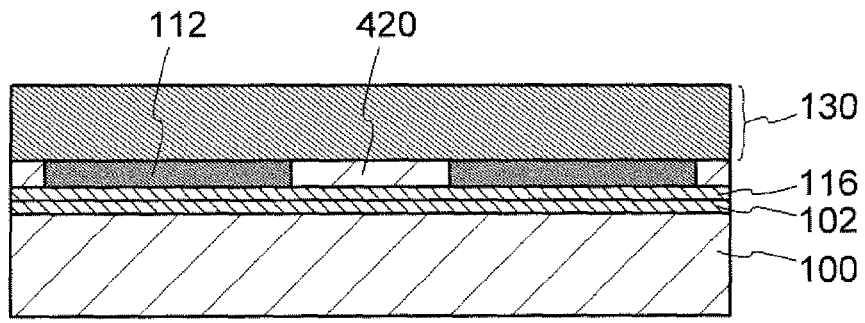
FIGS. 9A to 9D are cross-sectional views illustrating a method for manufacturing a semiconductor device.

First, a semiconductor substrate 150 manufactured by the method described in the aforementioned embodiment or the like is prepared (see FIG. 9A). The semiconductor substrate 150 has a structure in which the insulating layer 102, the insulating layer 116, the semiconductor layer 420, and the silicon carbide layer 130 are provided in this order over the base substrate 100. Note that the high conductivity region 112 is formed partly in the semiconductor layer 420. As a method for forming the high conductivity region 112, a method in which an impurity element imparting a conductivity type is selectively added after the semiconductor layer 420 is formed over a silicon carbide substrate in a manufacturing process (for example, a process corresponding to FIG. 3B) of the semiconductor substrate, a method in which an impurity element imparting a conductivity type is selectively added to the semiconductor layer 420 through the silicon carbide layer 130 after completion of the semiconductor substrate 150, or the like can be given. Although the semiconductor layer 420 may be formed using any material, silicon or silicon carbide can be used, for example. This embodiment describes the case where polysilicon is used as the semiconductor layer 420.

An impurity element imparting the first conductivity type is added to the silicon carbide layer 130. As an impurity element which can be added to the silicon carbide layer 130, phosphorus (P) or arsenic (As) which imparts n-type conductivity, and boron (B) or aluminum (Al) which imparts p-type conductivity, and the like can be employed. Here, the case of imparting n-type conductivity by adding phosphorus (P) will be described. That is, the first conductivity type is an n-type here.

Note that this embodiment employs a structure in which the high conductivity region 112 is provided selectively; however, one embodiment of the disclosed invention is not limited thereto and may employ a structure in which the high conductivity region 112 is provided under an entire bottom surface of the silicon carbide layer 130.

Figure 9B:
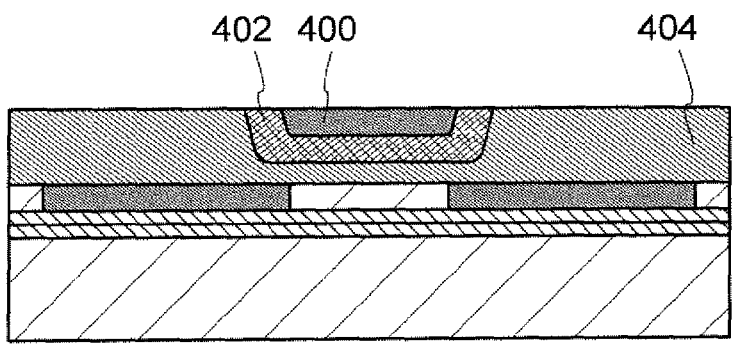
Figure 9C:
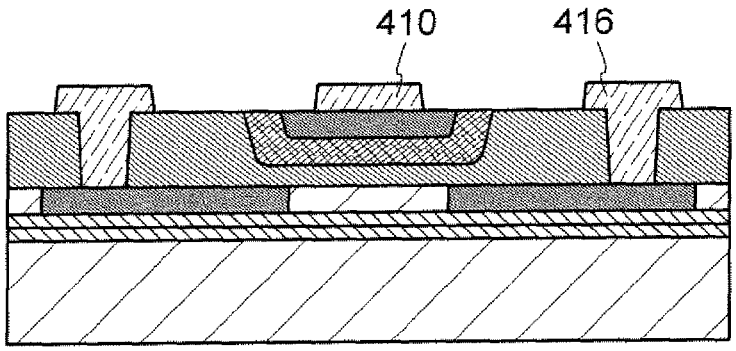

Next, an impurity element imparting p-type conductivity (for example, boron) and an impurity element imparting n-type conductivity (for example, phosphorus) are selectively added to the silicon carbide layer 130, thereby forming the first region 400 imparted with the first conductivity type and the second region 402 imparted with a conductivity type which is different from the first conductivity type (see FIG. 9B). Accordingly, the region in the silicon carbide layer 130, other than the first region 400 and the second region 402 becomes the third region 404. Here, part of the second region 402 functions as a channel formation region, and the first region 400 functions as a source region (or a drain region) later.

After forming the first region 400, the second region 402, and the third region 404, a contact hole which reaches to the high conductivity region 112 is formed. Then, the first electrode 410 is selectively formed so as to be in contact with the first region 400 and the third electrode 416 is selectively formed so as to be in contact with the high conductivity region 112 (see FIG. 9C). The contact hole can be formed by selective etching with the use of a resist mask or the like. Note that the first electrode 410 functions as a source electrode (or a drain electrode), and the third electrode 416 functions as a drain electrode (or a source electrode).

A material having high heat resistance is preferably used as the first electrode 410 and the third electrode 416. For example, titanium, molybdenum, tungsten, tantalum, chromium, nickel, or the like can be used. Alternatively, a material having low resistance, such as aluminum and copper may be used. Further, a semiconductor material (for example, polysilicon) to which an impurity element imparting a conductivity type is added may be used.

Figure 9D:
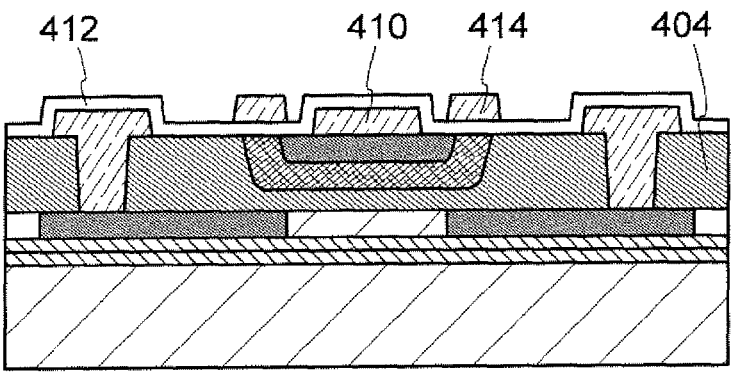

Then, the gate insulating layer 412 is formed so as to cover the silicon carbide layer 130, the first electrode 410, and the third electrode 416, and the second electrode 414 which functions as a gate electrode is selectively formed over the gate insulating layer 412 (see FIG. 9D). Here, it is preferable to form the second electrode 414 so that part of the second electrode 414 overlaps with the first region 400. Thus, the concentration of electric field is alleviated, whereby higher withstand voltage can be obtained. After that, an insulating layer may be formed so as to cover the second electrode 414.

The gate insulating layer 412 can be formed using a material, such as silicon oxide, silicon nitride, silicon oxynitride, silicon nitride oxide, hafnium oxide, aluminum oxide, and tantalum oxide. As a manufacturing method, a thermal oxidation method (a thermal nitridation method), a plasma CVD method, a sputtering method, a method using oxidation or nitridation by high density plasma treatment, and the like can be employed.

The second electrode 414 can be formed in a manner similar to those of the first electrode 410 and the third electrode 416.

As described above, a semiconductor device for electric power which is a so-called power MOSFET can be manufactured. As described in this embodiment, increasing the withstand voltage of a semiconductor element, reducing a loss of electric power, and the like can be realized by using silicon carbide for a power MOSFET. According to one embodiment of the disclosed invention, a semiconductor substrate containing silicon carbide can be provided at very low cost; therefore, manufacturing cost of a semiconductor element and a semiconductor device can be reduced.

This embodiment can be implemented in combination with any of the aforementioned embodiments, as appropriate.

[Embodiment 7]

This embodiment describes another example of a semiconductor device using a semiconductor substrate 150 manufactured by a method described in any of the aforementioned embodiments with reference to FIGS. 10A to 10D and FIGS. 11A to 11D. In particular, this embodiment describes a case of manufacturing an n-channel FET and a p-channel FET which are used for a CMOS circuit; however, a semiconductor element and a semiconductor device using the semiconductor element manufactured by using the semiconductor substrate is not particularly limited thereto.

Figure 10A:
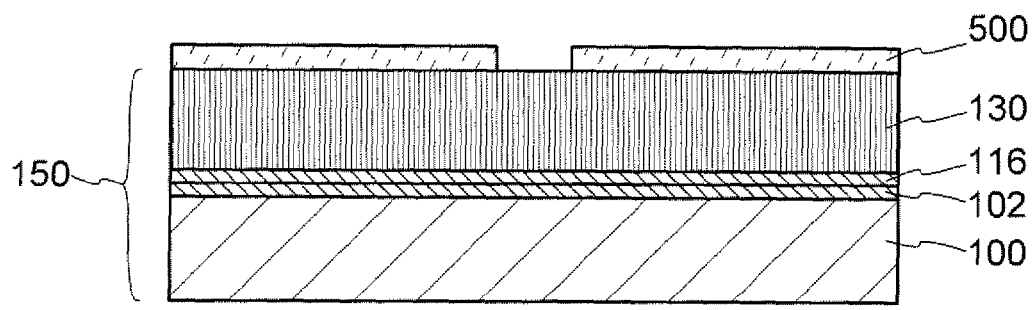
FIGS. 10A to 10D are cross-sectional views illustrating a method for manufacturing a semiconductor device.
Figure 10B:
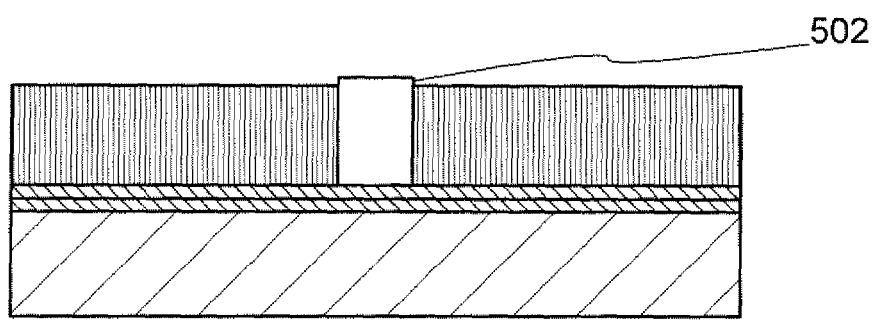

First, after the semiconductor substrate 150 is obtained in accordance with a method described in the aforementioned embodiment or the like, a protective layer 500 which functions as a mask for formation of an element isolation insulating layer is formed over a silicon carbide layer 130 (see FIG. 10A). A silicon oxide layer, a silicon nitride layer, or the like is used as the protective layer 500. Note that the semiconductor substrate 150 used in this embodiment is equivalent to that manufactured in accordance with the aforementioned embodiments.

To control threshold voltages of the silicon carbide layer 130, a p-type impurity such as boron, aluminum, or gallium or an n-type impurity such as phosphorus or arsenic may be added to the silicon carbide layer 130.

Next, etching is performed using the protective layer 500 as a mask and an exposed region of the silicon carbide layer 130 is removed. After that, an insulating layer is deposited. The insulating layer can be a silicon oxide layer, for example. The insulating layer may be formed by using any of a variety of film deposition techniques typified by a CVD method or a sputtering method. Here, the insulating layer is deposited thickly so as to be embedded in the silicon carbide layer 130.

Next, an insulating layer in a region overlapping with the silicon carbide layer 130 is removed by polishing, etching, or the like. Then, the protective layer 500 is removed and an element isolation insulating layer 502 formed of part of the insulating layer is left (see FIG. 10B). Note that this embodiment employs a structure in which the element isolation insulating layer 502 is provided; however, a structure in which the element isolation insulating layer 502 is not provided may be employed.

Figure 10C:
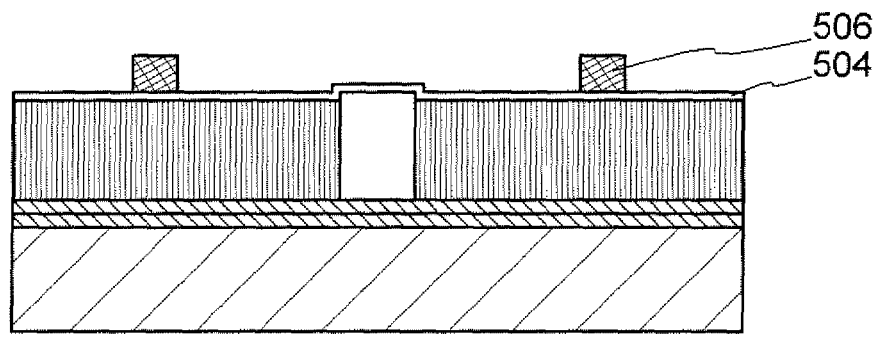
Figure 10D:
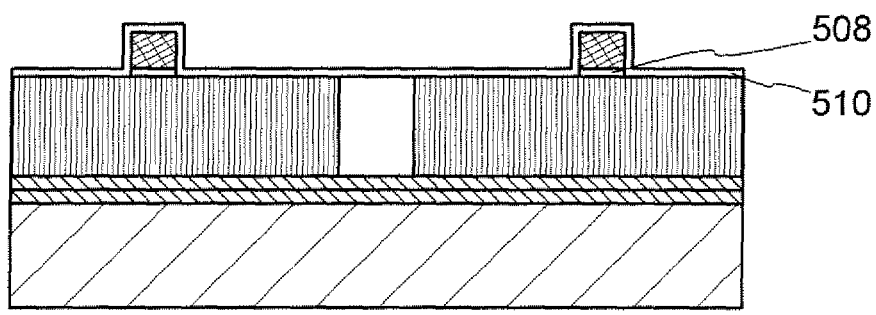

Next, an insulating layer 504 which functions as a gate insulating layer is formed and an gate electrode 506 is formed over the insulating layer 504 (see FIG. 10C). The insulating layer 504 can be formed by a CVD method, a sputtering method or the like. It is preferable that the insulating layer 504 be formed using silicon oxide, silicon nitride oxide, silicon nitride, hafnium oxide, aluminum oxide, tantalum oxide, or the like. Note that the insulating layer 504 may have a single-layer structure or a stacked layer structure. Here, a silicon oxide layer which covers a surface of the silicon carbide layer 130 is formed to have a single-layer structure by a CVD method.

A material having high heat resistance is preferably used for the gate electrode 506. For example, titanium, molybdenum, tungsten, tantalum, chromium, nickel, or the like can be used. Alternatively, the gate electrode 506 may be formed using a material having low resistance, such as aluminum and copper. Further, a semiconductor material (for example, polysilicon) to which an impurity element imparting a conductivity type is added may be used.

Note that in this embodiment, the gate electrode 506 employs a single-layer structure; however, a stacked layer structure may also be used. Further, combination of the aforementioned materials may be used. For example, combination of a material having high heat resistance and a material having low resistance, such as a stacked layer structure of titanium and aluminum or a stacked layer structure of tungsten and aluminum may be used. Further, a stacked layer structure of the aforementioned metal material and nitride of the metal material may be employed. For example, a stacked layer structure of a titanium nitride layer and a titanium layer, a stacked layer structure of a tantalum nitride layer and a tantalum layer, a stacked layer structure of a tungsten nitride layer and a tungsten layer, and the like can be used. Note that the gate electrode 506 may be formed using an evaporation method, a sputtering method, or the like.

Next, the insulating layer 504 is etched using the gate electrode 506 as a mask to form a gate insulating layer 508. In this etching, part of the element isolation insulating layer 502 is etched. After that, an insulating layer 510 which covers the gate electrode 506 is formed (see FIG. 10D).

Figure 11A:
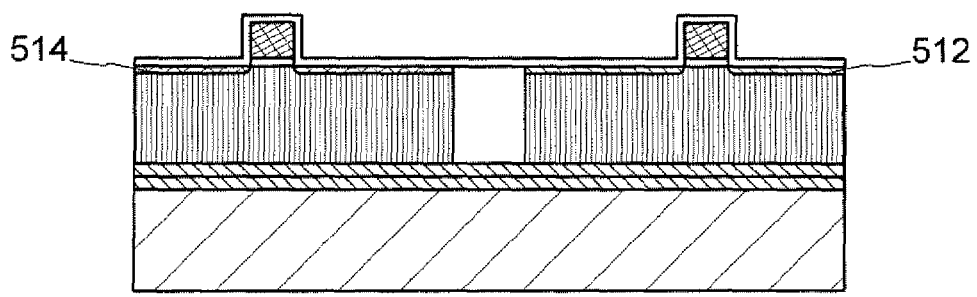
FIGS. 11A to 11D are cross-sectional views illustrating a method for manufacturing a semiconductor device.

Next, a region which is to be an n-channel FET later is doped with phosphorus (P), arsenic (As), or the like at a low concentration to form a first impurity region 512, and a region which is to be a p-channel FET later is doped with boron (B) or the like at a low concentration to form a second impurity region 514 (see FIG. 11A). Note that although the impurity regions are formed after formation of the insulating layer 510 here, the impurity regions may be formed before the insulating layer 510 is formed.

Figure 11B:
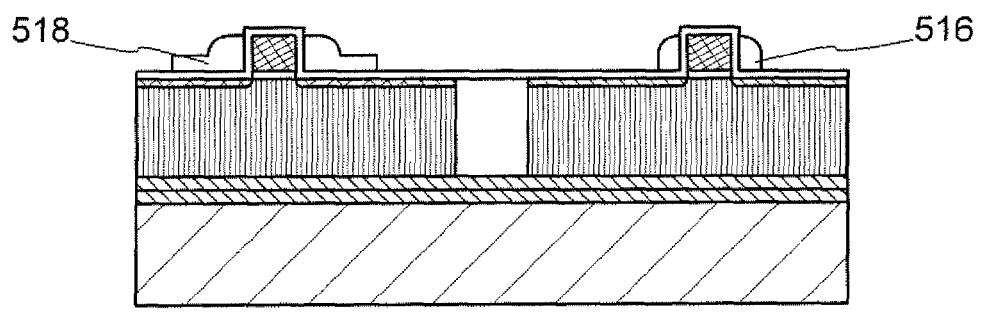
Figure 11C:
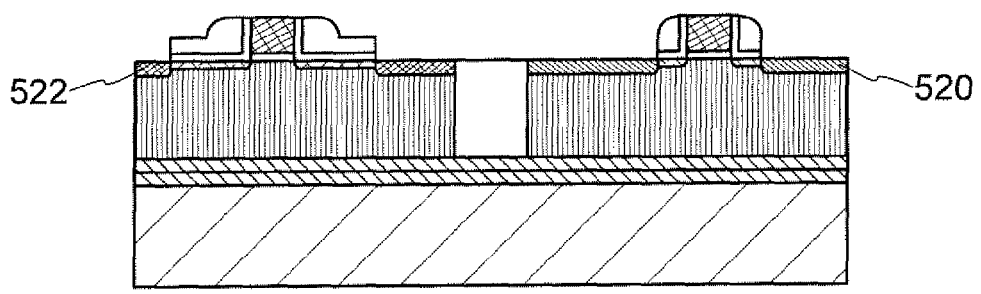
Figure 11D:
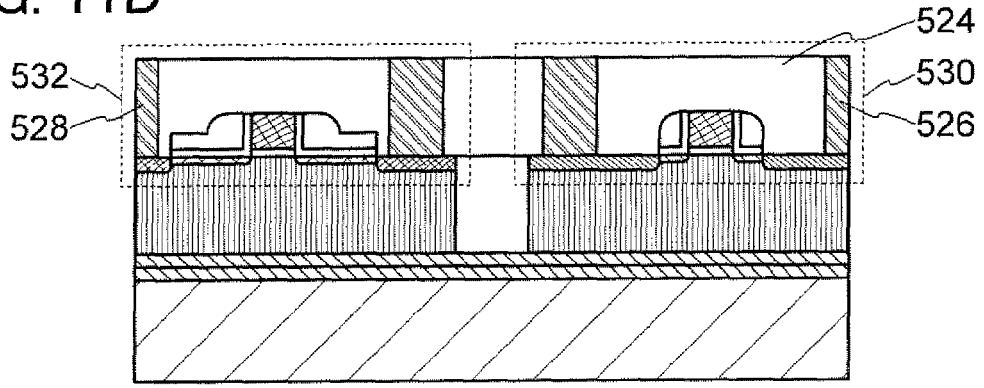

After that, a sidewall insulating layer 516 and a sidewall insulating layer 518 are formed (see FIG. 11B). The sidewall insulating layer 518 of the region which is to be the p-channel FET is preferably larger in width (the length in a channel length direction) than the sidewall insulating layer 516 of the region which is to be the n-channel FET.

Next, the insulating layer 510 is partly etched to expose a surface of the first impurity region 512 and a surface of the second impurity region 514. At this time, a top surface of the gate electrode 506 is also exposed. Then, the region which is to be the n-channel FET is doped with phosphorus (P), arsenic (As), or the like at a high concentration to form a third impurity region 520, and the region which is to be the p-channel FET is doped with boron (B) or the like at a high concentration to form a fourth impurity region 522 (see FIG. 11C). Note that although the impurity regions are formed after the insulating layer 510 is partly etched here, the impurity regions may be formed before the insulating layer 510 is etched.

Next, an interlayer insulating layer 524 is formed and a contact plug 526 and a contact plug 528 which reach the third impurity region 520 and the fourth impurity region 522, respectively, are formed. As described above, an n-channel FET 530 and a p-channel FET 532 can be manufactured using the silicon carbide layer 130 formed over the base substrate 100 (see FIG. 11D).

The n-channel FET 530 and the p-channel FET 532 can be complementarily combined to form a CMOS circuit. Further, a variety of semiconductor devices can be manufactured by using such a semiconductor element.

As described in this embodiment, increasing the withstand voltage of a semiconductor element, reducing a loss of electric power, and the like can be realized by using silicon carbide for a FET. According to one embodiment of the disclosed invention, a semiconductor substrate containing silicon carbide can be provided at very low cost; therefore, manufacturing cost of a semiconductor element and a semiconductor device can be reduced.

This embodiment can be implemented in combination with the aforementioned embodiment, as appropriate.

This application is based on Japanese Patent Application serial no. 2009-167615 with Japan Patent Office on Jul. 16, in 2009, the entire contents of which are hereby incorporated by reference.

What is claimed is:

1. A method for manufacturing a semiconductor substrate, comprising the steps of:
    forming a conductivity region on a surface of a silicon carbide substrate;
    adding ions to the silicon carbide substrate to form an embrittlement region in the silicon carbide substrate;
    bonding the silicon carbide substrate to a base substrate with an insulating layer interposed between the silicon carbide substrate and the base substrate;
    heating the silicon carbide substrate and separating the silicon carbide substrate at the embrittlement region to form the conductivity region and a silicon carbide layer over the base substrate with the insulating layer interposed between the base substrate and the conductivity region; and
    performing heat treatment on the silicon carbide layer to reduce defects in the silicon carbide layer,
    wherein the conductivity region is formed using a material containing silicon, and
    wherein the insulating layer is formed by thermal oxidation treatment of the conductivity region.

2. The method for manufacturing a semiconductor substrate according to claim 1, wherein the conductivity region has higher conductivity than the silicon carbide substrate.

3. The method for manufacturing a semiconductor substrate according to claim 1, wherein the heat treatment is performed at a temperature of 1000° C. to 1300° C.

4. A method for manufacturing a semiconductor substrate, comprising the steps of:
    forming a conductivity region on a first surface of a silicon carbide substrate;
    adding ions to the silicon carbide substrate to form an embrittlement region in the silicon carbide substrate;
    bonding the silicon carbide substrate to a base substrate with an insulating layer interposed between the silicon carbide substrate and the base substrate
    heating the silicon carbide substrate and separating the silicon carbide substrate at the embrittlement region to form the conductivity region and a silicon carbide layer over the base substrate with the insulating layer interposed between the base substrate and the conductivity region; and
    performing heat treatment on the silicon carbide layer to reduce defects in the silicon carbide layer,
    wherein the silicon carbide layer includes a first impurity element imparting a first conductivity type,
    wherein the conductivity region is formed using a material containing silicon, and
    wherein the insulating layer is formed by thermal oxidation treatment of the conductivity region.

5. The method for manufacturing a semiconductor substrate according to claim 4, wherein the conductivity region has higher conductivity than the silicon carbide layer.

6. The method for manufacturing a semiconductor substrate according to claim 4, wherein the heat treatment is performed at a temperature of 1000° C. to 1300° C.

7. The method for manufacturing a semiconductor substrate according to claim 4, wherein the first impurity element is selected from the group of phosphorous, arsenic, boron, and aluminum.

8. The method for manufacturing a semiconductor substrate according to claim 4, further comprising the step of forming a first region imparted with the first conductivity type and a second region imparted with a second conductivity type in the silicon carbide layer,
    wherein the second region is in contact with the first region.

9. The method for manufacturing a semiconductor substrate according to claim 8, wherein an impurity concentration of the first region is higher than an impurity concentration of the silicon carbide layer.

10. The method for manufacturing a semiconductor substrate according to claim 8, further comprising the step of forming a third region imparted with the first conductivity type on a second surface of the silicon carbide layer,
    wherein the second surface is on an opposite side to the first surface,
    wherein the third region is not in contact with the second region, and
    wherein the third region has higher conductivity than the silicon carbide layer.

11. The method for manufacturing a semiconductor substrate according to claim 8, further comprising the step of forming a third region imparted with the second conductivity type in the silicon carbide layer.

12. The method for manufacturing a semiconductor substrate according to claim 8, wherein the first region is surrounded by the second region.

13. A method for manufacturing a semiconductor substrate, comprising the steps of:
    forming a semiconductor layer on a silicon carbide substrate;
    forming partly a conductivity region in the semiconductor layer;
    adding ions to the silicon carbide substrate to form an embrittlement region in the silicon carbide substrate;
    bonding the silicon carbide substrate to a base substrate with an insulating layer interposed between the silicon carbide substrate and the base substrate
    heating the silicon carbide substrate and separating the silicon carbide substrate at the embrittlement region to form the semiconductor layer and a silicon carbide layer over the base substrate with the insulating layer interposed between the base substrate and the conductivity region; and
    performing heat treatment on the silicon carbide layer to reduce defects in the silicon carbide layer.

14. The method for manufacturing a semiconductor substrate according to claim 13, wherein the silicon carbide layer comprises a first impurity element imparting a first conductivity type.

15. The method for manufacturing a semiconductor substrate according to claim 13, wherein the conductivity region has higher conductivity than the silicon carbide layer.

16. The method for manufacturing a semiconductor substrate according to claim 14, wherein the first impurity element is selected from the group of phosphorous, arsenic, boron, and aluminum.

17. The method for manufacturing a semiconductor substrate according to claim 14, further comprising the step of forming a first region imparted with the first conductivity type and a second region imparted with a second conductivity type in the silicon carbide layer, wherein the second region is in contact with the first region.

18. The method for manufacturing a semiconductor substrate according to claim 17, wherein the first region is surrounded by the second region.

* * * * *